(12) United States Patent
Lee et al.

(10) Patent No.: US 11,907,455 B2
(45) Date of Patent: Feb. 20, 2024

(54) INPUT SENSING PART AND DISPLAY DEVICE INCLUDING THE SAME

(71) Applicant: Samsung Display Co., Ltd., Yongin-si (KR)

(72) Inventors: Hyun Jae Lee, Seongnam-si (KR); Sunghwan Kim, Ulsan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/895,251

(22) Filed: Aug. 25, 2022

(65) Prior Publication Data

US 2023/0168756 A1 Jun. 1, 2023

(30) Foreign Application Priority Data

Nov. 26, 2021 (KR) ................. 10-2021-0165606

(51) Int. Cl.
| | | |
|---|---|---|
| G06F 3/041 | (2006.01) | |
| H01L 27/32 | (2006.01) | |
| G06F 3/044 | (2006.01) | |
| H01Q 9/04 | (2006.01) | |
| H01Q 1/22 | (2006.01) | |
| H01Q 1/48 | (2006.01) | |
| H10K 59/40 | (2023.01) | |

(52) U.S. Cl.
CPC .......... *G06F 3/0412* (2013.01); *G06F 3/0443* (2019.05); *H01Q 1/22* (2013.01); *H01Q 1/48* (2013.01); *H01Q 9/0407* (2013.01); *H10K 59/40* (2023.02); *G06F 3/0446* (2019.05); *G06F 3/0448* (2019.05); *G06F 2203/04112* (2013.01)

(58) Field of Classification Search
CPC .. G06F 3/04164; G06F 3/0412; G06F 3/0443; G06F 2203/04112; G06F 3/0446; G06F 3/0448; H01Q 1/243; H01Q 9/0407; H01Q 1/22; H01Q 1/48; H01Q 1/38; H10K 59/40
See application file for complete search history.

(56) References Cited

U.S. PATENT DOCUMENTS

| | | | |
|---|---|---|---|
| 10,990,234 | B2 | 4/2021 | Kim et al. |
| 2020/0393936 | A1 | 12/2020 | Bok et al. |
| 2022/0158328 | A1* | 5/2022 | Kim .................. H01Q 5/22 |

FOREIGN PATENT DOCUMENTS

| | | |
|---|---|---|
| KR | 10-2009382 | 8/2019 |
| KR | 10-2046564 | 11/2019 |
| KR | 10-2020-0143628 | 12/2020 |
| KR | 10-2020-0144076 | 12/2020 |
| KR | 10-2204410 | 1/2021 |

* cited by examiner

*Primary Examiner* — Deeprose Subedi
(74) *Attorney, Agent, or Firm* — KILE PARK REED & HOUTTEMAN PLLC

(57) ABSTRACT

Disclosed is an input sensing part that includes sensing electrodes disposed in an active area, a first ground pattern disposed in an inactive area around the active area, a first ground pad disposed in the inactive area and electrically connected to the first ground pattern, a first antenna pattern insulated from the sensing electrodes and disposed in the active area, a first signal pad that extends from the first antenna pattern and disposed in the inactive area, a 1-1-th ground pad disposed adjacent to the first signal pad and electrically connected to the first ground pattern, and a 1-2-th ground pad disposed adjacent to the first signal pad.

20 Claims, 17 Drawing Sheets

INPUT SENSING PART AND DISPLAY DEVICE INCLUDING THE SAME

CROSS-REFERENCE TO RELATED APPLICATION(S)

This application claims priority to and benefits of Korean Patent Application No. 10-2021-0165606 under 35 U.S.C. § 119 filed on Nov. 26, 2021, in the Korean Intellectual Property Office, the entire contents of which are incorporated herein by reference.

BACKGROUND

1. Technical Field

Embodiments described herein relate to an input sensing part and a display device including the same.

2. Description of the Related Art

Electronic devices, such as a smart phone, a digital camera, a notebook computer, a navigation system, a smart television, and the like, which provide an image to a user include a display device for displaying an image. The display device generates an image and provides the generated image to the user through a display screen. The display device may include a display panel including pixels that generate an image.

With the development of information society, wireless communication technology, such as Wi-Fi and Bluetooth, is combined with a display device and implemented in a form such as a smart phone. An antenna may be coupled to the display device to perform a communication function.

The display device may include a display panel that displays an image and an input sensing part that is disposed on the display panel and that senses an external input. The antenna may be disposed in the input sensing part.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide an input sensing part for decreasing an inactive area and a display device including the input sensing part.

According to an embodiment, an input sensing part may include sensing electrodes disposed in an active area; a first ground pattern disposed in an inactive area around the active area; a first ground pad disposed in the inactive area and electrically connected to the first ground pattern; a first antenna pattern insulated from the sensing electrodes and disposed in the active area; a first signal pad extending from the first antenna pattern and disposed in the inactive area; a 1-1-th ground pad disposed adjacent to the first signal pad and electrically connected to the first ground pattern, and a 1-2-th ground pad disposed adjacent to the first signal pad.

The first antenna pattern may be disposed between a number of the sensing electrodes.

The first ground pattern, the first signal pad, and the 1-1-th ground pad may be disposed on a same layer.

The 1-1-th ground pad may extend from the first ground pattern and may be integral with the first ground pattern.

The input sensing part may further include a second ground pattern disposed in the inactive area; a second ground pad disposed in the inactive area and electrically connected to the second ground pattern; a second antenna pattern insulated from the sensing electrodes and disposed in the active area; a second signal pad extending from the second antenna pattern and disposed in the inactive area; a 2-1-th ground pad disposed adjacent to the second signal pad and electrically connected to the second ground pattern; and a 2-2-th ground pad disposed adjacent to the second signal pad.

The 2-1-th ground pad may extend from the second ground pattern and may be integral with the second ground pattern.

The input sensing part may further include a third ground pattern electrically connected to the 1-2-th ground pad and the 2-2-th ground pad.

The 1-2-th ground pad and the 2-2-th ground pad may extend from the third ground pattern and may be integral with the third ground pattern.

The 1-1-th ground pad, the 1-2-th ground pad, the 2-1-th ground pad, the 2-2-th ground pad, the first ground pattern, the second ground pattern, and the third ground pattern may be disposed on different layers, and the 1-1-th ground pad, the 1-2-th ground pad, the 2-1-th ground pad, and the 2-2-th ground pad may be electrically connected to the first ground pattern, the second ground pattern, and the third ground pattern.

The second antenna pattern may be disposed between a number of the sensing electrodes.

The second antenna pattern may include a 2-1-th antenna pattern disposed between a number of the sensing electrodes; a 2-2-th antenna pattern disposed in at least one opening of at least one of the sensing electrodes; and a bridge pattern electrically connecting the 2-1-th antenna pattern and the 2-2-th antenna pattern.

The input sensing part may further include dummy patterns disposed between the sensing electrodes and in openings of the sensing electrodes.

The input sensing part may further include a base layer including the active area and the inactive area in the base layer; and a flexible circuit board disposed on the base layer and electrically connected to an end of the first ground pattern and the 1-1-th ground pad, wherein the end of the first ground pattern and the 1-1-th ground pad may be spaced apart from each other in a first direction, a bending line extending in a second direction intersecting the first direction may be defined between the end of the first ground pattern and the 1-1-th ground pad, and the base layer and the flexible circuit board may be bent along the bending line.

The input sensing part may further include at least one first connecting line disposed on the flexible circuit board and electrically connecting the end of the first ground pattern and the 1-1-th ground pad.

The input sensing part may further include at least one second connecting line disposed on the base layer and electrically connecting the end of the first ground pattern and the 1-1-th ground pad, the second connecting line having a wavy shape.

The input sensing part may further include at least one first connecting line disposed on the flexible circuit board and electrically connecting the end of the first ground pattern and the 1-1-th ground pad; and at least one second connecting line disposed on the base layer and electrically connecting the end of the first ground pattern and the 1-1-th ground pad.

The input sensing part may further include dummy lines disposed near the at least one second connecting line.

The dummy lines may be electrically connected to the first ground pattern.

According to an embodiment, an input sensing part may include sensing electrodes disposed in an active area; a ground pattern disposed in an inactive area around the active area; a ground pad disposed in the inactive area and electrically connected to the ground pattern; and an antenna disposed in the active area and extending to the inactive area, and the ground pattern may be electrically connected to a ground terminal of the antenna.

According to an embodiment, a display device may include a display panel and an input sensing part disposed on the display panel. The input sensing part may include sensing electrodes disposed in an active area; a first ground pattern disposed in an inactive area around the active area; a first ground pad disposed in the inactive area and electrically connected to the first ground pattern; a first antenna pattern insulated from the sensing electrodes and disposed in the active area; a first signal pad extending from the first antenna pattern and disposed in the inactive area; a 1-1-th ground pad disposed adjacent to the first signal pad and electrically connected to the first ground pattern; and a 1-2-th ground pad disposed adjacent to the first signal pad.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1:
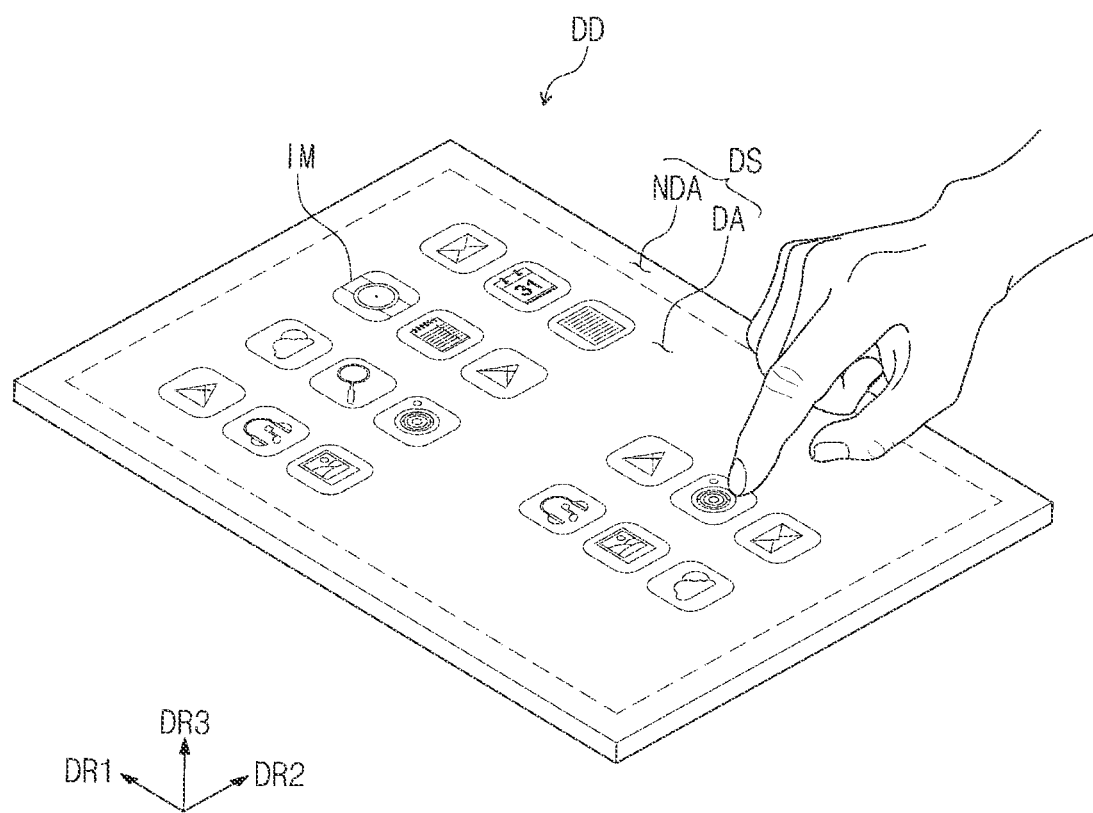
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when it is mentioned that a component (or, an area, a layer, a part, etc.) is referred to as being "on", "connected to" or "coupled to" another component, this means that the component may be directly on, connected to, or coupled to the other component or a third component or other components may be present therebetween.

It will be understood that the terms "connected to" or "coupled to" may include a physical or electrical connection or coupling.

Identical reference numerals refer to identical components. In the drawings, the thicknesses, proportions, and dimensions of components are exaggerated for effective description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms such as first, second, and the like may be used to describe various components, but the components should not be limited by the terms. The terms may be used only for distinguishing one component from other components. For example, without departing the scope of the disclosure, a first component may be referred to as a second component, and similarly, the second component may also be referred to as the first component.

The terms of a singular form may include plural forms unless otherwise specified. For example, as used herein, the singular forms, "a," "an," and "the" are intended to include the plural forms as well, unless the context clearly indicates otherwise.

Terms such as "below", "under", "above", and "over" are used to describe a relationship of components illustrated in the drawings. The terms are relative concepts and are described based on directions illustrated in the drawing but are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

It should be understood that terms such as "comprises," "comprising," "includes," and/or "including,", "has," "have," and/or "having," and variations thereof when used in this specification, specify the presence of stated features, numbers, integers, steps, operations, elements, components, parts and/or groups thereof, but do not preclude the presence or addition of one or more other features, numbers, integers, steps, operations, elements, components, parts and/or groups or combinations thereof.

Hereinafter, embodiments will be described with reference to the accompanying drawings.

FIG. 1 is a schematic perspective view of a display device according to an embodiment.

Referring to FIG. 1, the display device DD according to an embodiment may have a rectangular shape with long sides extending in a first direction DR1 and short sides extending in a second direction DR2 intersecting the first direction DR1. However, without being limited thereto, the display device DD may have various shapes such as a circular shape, a polygonal shape, or the like within the spirit and the scope of the disclosure. It is to be understood that the shapes disclosed herein also include shapes substantial to those shapes disclosed herein.

Hereinafter, a direction substantially perpendicular to a plane defined by the first direction DR1 and the second direction DR2 is defined as a third direction DR3. As used herein, the expression "when viewed on the plane" may mean that it is viewed in the third direction DR3.

The upper surface of the display device DD may be defined as a display surface DS and may have a plane defined by the first direction DR1 and the second direction DR2. Images IM generated by the display device DD may be provided to a user through the display surface DS.

The display surface DS may include a display area DA and a non-display area NDA around the display area DA. The display area DA may display an image, and the non-display area NDA may not display an image. The non-display area NDA may surround the display area DA and may define the border of the display device DD printed in a color.

The display device DD may be used in large electronic devices such as a television, a monitor, or outdoor signage. The display device DD may be used in small and medium-sized electronic devices such as a personal computer, a notebook computer, a personal digital terminal, a car navigation system, a game machine, a smart phone, a tablet computer, or a camera. However, these electronic devices are illustrative, and the display device DD may be used in other electronic devices without departing from the spirit and scope of the disclosure.

Figure 2:
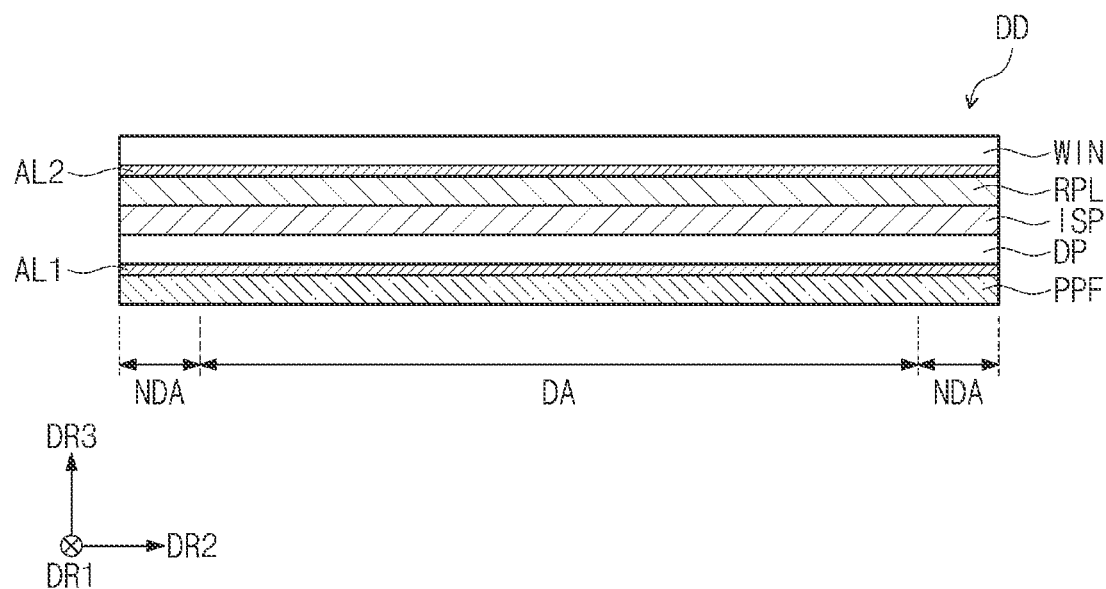
FIG. 2 is a schematic cross-sectional view of the display device illustrated in FIG. 1.

FIG. 2 is a schematic cross-sectional view of the display device illustrated in FIG. 1.

In FIG. 2, a section of the display device DD viewed in the first direction DR1 is illustrated.

Referring to FIG. 2, the display device DD may include a display panel DP, an input sensing part ISP, an anti-reflection layer RPL, a window WIN, a panel protection film PPF, and first and second adhesive layers AL1 and AL2.

The display panel DP may be a flexible display panel. The display panel DP according to an embodiment may be an emissive display panel, but is not particularly limited. For example, the display panel DP may be an organic light emitting display panel or an inorganic light emitting display panel. An emissive layer of the organic light emitting display panel may contain an organic light emitting material. An emissive layer of the inorganic light emitting display panel may contain quantum dots, quantum rods, and the like within the spirit and the scope of the disclosure. Hereinafter, it will be described that the display panel DP is an organic light emitting display panel.

The input sensing part ISP may be disposed on the display panel DP. The input sensing part ISP may include sensing parts (not illustrated) for sensing an external input in a capacitive manner. The input sensing part ISP may be directly manufactured on the display panel DP in manufacture of the display device DD. However, without being limited thereto, the input sensing part ISP may be manufactured as a panel separate from the display panel DP and may be attached to the display panel DP by an adhesive layer.

The anti-reflection layer RPL may be disposed on the input sensing part ISP. The anti-reflection layer RPL may be directly manufactured on the input sensing part ISP in the manufacture of the display device DD. However, without being limited thereto, the anti-reflection layer RPL may be manufactured as a separate panel and may be attached to the input sensing layer ISP by an adhesive layer.

The anti-reflection layer RPL may be defined as a film for preventing reflection of external light. The anti-reflection layer RPL may decrease the reflectivity of external light incident toward the display panel DP from above the display device DD.

In case that external light traveling toward the display panel DP is reflected from the display panel DP and provided back to the user, the user may visually recognize the external light as in a mirror. To prevent such a phenomenon, the anti-reflection layer RPL may include color filters that display the same colors as pixels of the display panel DP.

External light may be filtered in the same colors as those of the pixels by the color filters. The external light may not be visible to the user. However, without being limited thereto, the anti-reflection layer RPL may include a polarizer film for decreasing the reflectivity of external light. The polarizer film may include a phase retarder and/or a polarizer.

The window WIN may be disposed over the anti-reflection layer RPL. The window WIN may protect the display panel DP, the input sensing part ISP, and the anti-reflection layer RPL from external scratches and impacts.

The panel protection film PPF may be disposed under or below the display panel DP. The panel protection film PPF may protect a lower portion of the display panel DP. The panel protection film PPF may contain a flexible plastic material such as polyethylene terephthalate (PET).

The first adhesive layer AL1 may be disposed between the display panel DP and the panel protection film PPF, and the display panel DP and the panel protection film PPF may be bonded to each other by the first adhesive layer AL1. The second adhesive layer AL2 may be disposed between the window WIN and the anti-reflection layer RPL, and the window WIN and the anti-reflection layer RPL may be bonded to each other by the second adhesive layer AL2.

Figure 3:
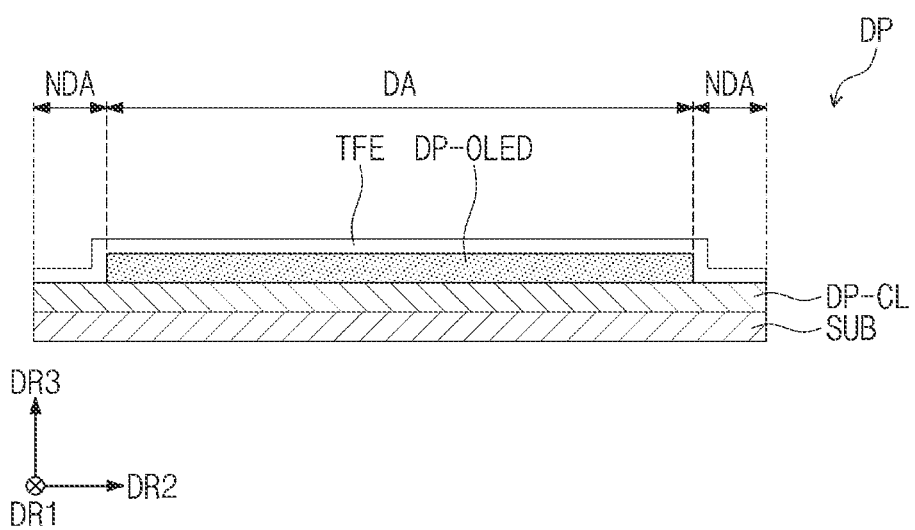
FIG. 3 is a schematic cross-sectional view of a display panel illustrated in FIG. 2.

FIG. 3 is a schematic cross-sectional view of the display panel illustrated in FIG. 2.

In FIG. 3, a section of the display panel DP viewed in the first direction DR1 is illustrated.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA around the display area DA. The substrate SUB may contain a flexible plastic material such as glass or polyimide (PI). The display element layer DP-OLED may be disposed over the display area DA.

Pixels may be disposed in the circuit element layer DP-CL and the display element layer DP-OLED. Each of the pixels may include a transistor disposed in the circuit element layer DP-CL and a light emitting element disposed in the display element layer DP-OLED and connected to the transistor. A configuration of the pixel will be described below in detail.

The thin-film encapsulation layer TFE may be disposed on the circuit element layer DP-CL to cover or overlap the display element layer DP-OLED. The thin-film encapsulation layer TFE may protect the pixels from moisture, oxygen, and external foreign matter.

Figure 4:
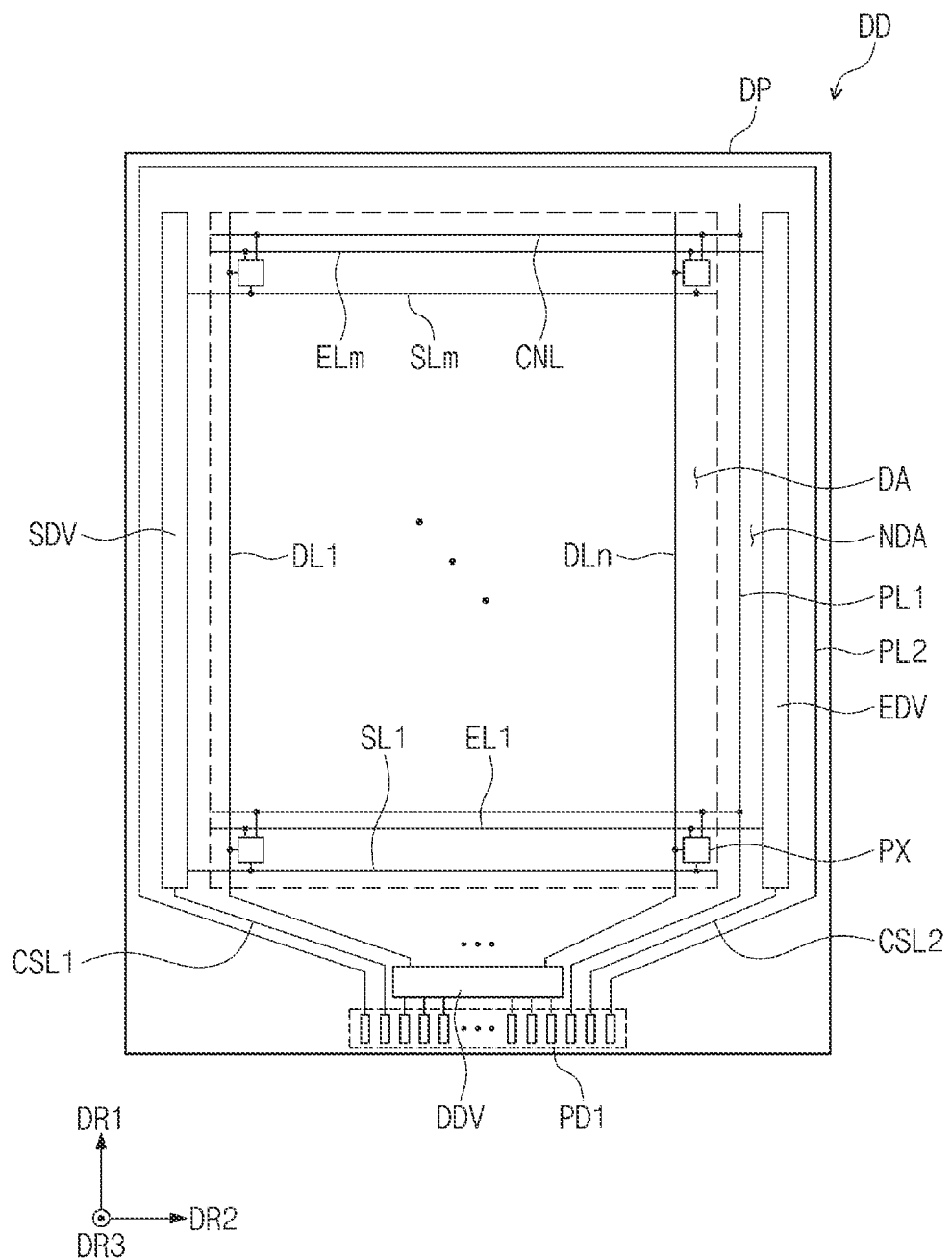
FIG. 4 is a schematic plan view of the display panel illustrated in FIG. 2.

FIG. 4 is a schematic plan view of the display panel illustrated in FIG. 2.

Referring to FIG. 4, the display device DD may include the display panel DP, a scan driver SDV, a data driver DDV, a light emission driver EDV, and first pads PD1.

The display panel DP may have a rectangular shape with long sides extending in the first direction DR1 and short sides extending in the second direction DR2. However, the shape of the display panel DP is not limited thereto. The display panel DP may include a display area DA and a non-display area NDA surrounding the display area DA.

The display panel DP may include pixels PX, scan lines SL1 to SLm, data lines DL1 to DLn, light emission lines EL1 to ELm, first and second control lines CSL1 and CSL2, first and second power lines PL1 and PL2, and connecting lines CNL. "m" and "n" are natural numbers.

The pixels PX may be disposed in the display area DA. The scan driver SDV and the light emission driver EDV may be disposed in the non-display areas NDA adjacent to the long sides of the display panel DP, respectively. The data driver DDV may be disposed in the non-display area NDA adjacent to one of the short sides of the display panel DP. When viewed on the plane, the data driver DDV may be adjacent to a lower end of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The light emission lines EL1 to ELm may extend in the second direction DR2 and may be connected to the pixels PX and the light emission driver EDV.

The first power line PL1 may extend in the first direction DR1 and may be disposed in the non-display area NDA. The first power line PL1 may be disposed between the display area DA and the light emission driver EDV. However, without being limited thereto, the first power line PL1 may be disposed between the display area DA and the scan driver SDV.

The connecting lines CNL may extend in the second direction DR2 and may be arranged (or disposed) in the first direction DR1 and connected to the first power line PL1 and the pixels PX. A first voltage may be applied to the pixels PX through the first power line PL1 and the connecting lines CNL connected with each other.

The second power line PL2 may be disposed in the non-display area NDA and may extend along the long sides of the display panel DP and the other short side of the display panel DP where the data driver DDV is not disposed. The second power line PL2 may be disposed outward of the scan driver SDV and the light emission driver EDV.

Although not illustrated, the second power line PL2 may extend toward the display area DA and may be connected to the pixels PX. A second voltage having a lower level than the first voltage may be applied to the pixels PX through the second power line PL2.

The first control line CSL1 may be connected to the scan driver SDV and may extend toward the lower end of the display panel DP. The second control line CSL2 may be connected to the light emission driver EDV and may extend toward the lower end of the display panel DP. The data driver DDV may be disposed between the first control line CSL1 and the second control line CSL2.

The first pads PD1 may be disposed in the non-display area NDA adjacent to the lower end of the display panel DP and may be closer to the lower end of the display panel DP than the data driver DDV. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

Although not illustrated, the display device DD may further include a timing controller for controlling operations of the scan driver SDV, the data driver DDV, and the light emission driver EDV and a voltage generator for generating the first and second voltages. The timing controller and the voltage generator may be connected to the corresponding first pads PD1 through a printed circuit board.

The scan driver SDV may generate scan signals, and the scan signals may be applied to the pixels PX through the scan lines SL1 to SLm. The data driver DDV may generate data voltages, and the data voltages may be applied to the pixels PX through the data lines DL1 to DLn. The light emission driver EDV may generate light emission signals, and the light emission signals may be applied to the pixels PX through the light emission lines EL1 to ELm.

The pixels PX may receive the data voltages in response to the scan signals. The pixels PX may display an image by emitting light having luminance corresponding to the data voltages in response to the light emission signals.

Figure 5:
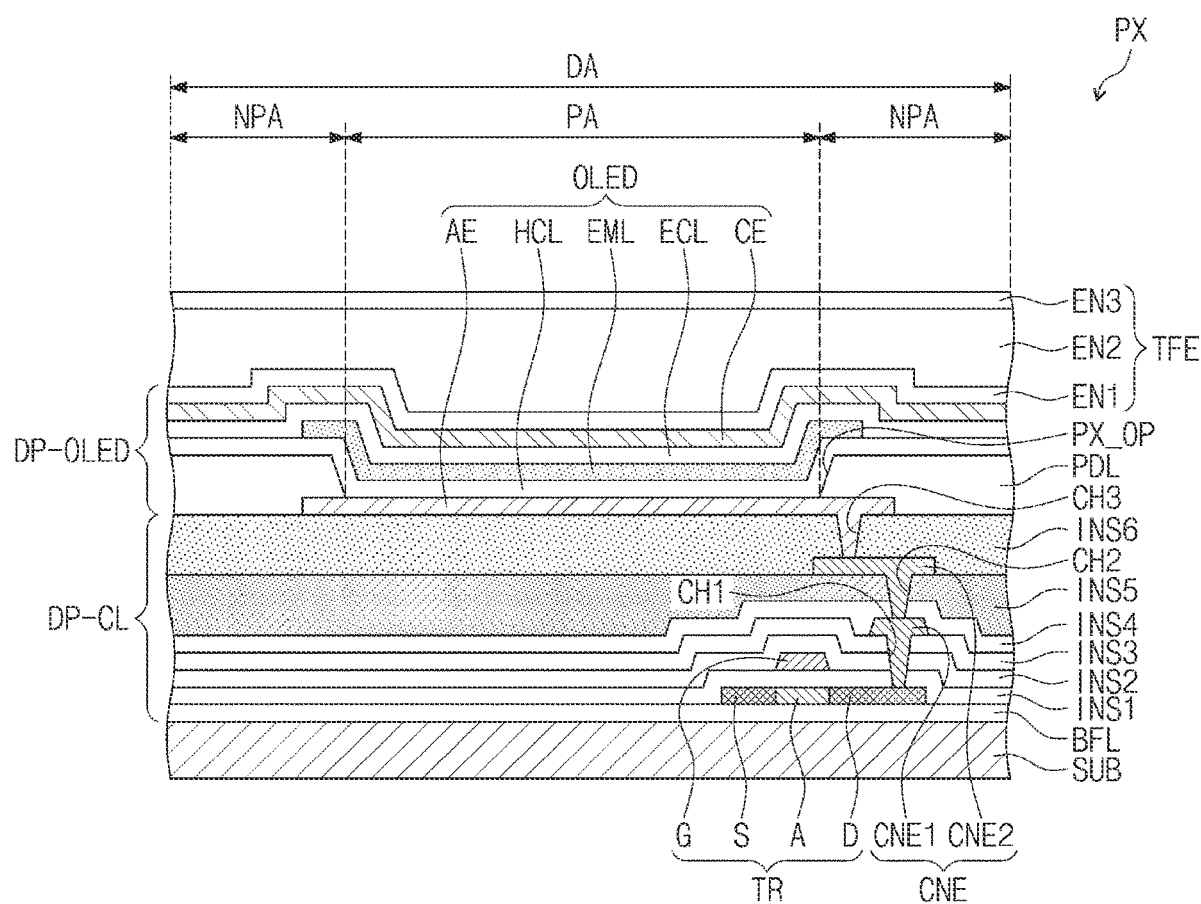
FIG. 5 is a schematic cross-sectional view of any one pixel illustrated in FIG. 4.

FIG. 5 is a schematic cross-sectional view of any one pixel illustrated in FIG. 4.

Referring to FIG. 5, the pixel PX may include a transistor TR and a light emitting element OLED. The light emitting element OLED may include a first electrode AE (or, an anode), a second electrode CE (or, a cathode), a hole control layer HCL, an electron control layer ECL, and an emissive layer EML.

The transistor TR and the light emitting element OLED may be disposed over the substrate SUB. Although one transistor TR is illustrated, the pixel PX may substantially include transistors and at least one capacitor for driving the light emitting element OLED.

The display area DA may include an emissive area PA corresponding to each of the pixels PX and a non-emissive area NPA around the emissive area PA. The light emitting element OLED may be disposed in the emissive area PA.

A buffer layer BFL may be disposed on the substrate SUB. The buffer layer BFL may be an inorganic layer. A semiconductor pattern may be disposed on the buffer layer BFL. The semiconductor pattern may contain poly silicon, amorphous silicon, or metal oxide.

The semiconductor pattern may be doped with an N-type dopant or a P-type dopant. The semiconductor pattern may include a heavily doped area and a lightly doped area. The heavily doped area may have a higher conductivity than the lightly doped area and may substantially serve as a source electrode and a drain electrode of the transistor TR. The lightly doped area may substantially correspond to an active (or, channel) area of the transistor TR.

A source S, an active area A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

To connect the transistor TR and the light emitting element OLED, a connecting electrode CNE may include a first connecting electrode CNE1 and a second connecting electrode CNE2. The first connecting electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connecting electrode CNE1. A fifth insulating layer INS5 may be disposed on the fourth insulating layer INS4. The second connecting electrode CNE2 may be disposed on the fifth insulating layer INS5. The second connecting electrode CNE2 may be connected to the first connecting electrode CNE1 through a second contact hole CH2 defined in the fourth and fifth insulating layers INS4 and INS5.

A sixth insulating layer INS6 may be disposed on the second connecting electrode CNE2. The layers from the buffer layer BFL to the sixth insulating layer INS6 may be defined as the circuit element layer DP-CL. The first to sixth insulating layers INS1 to INS6 may be inorganic layers or organic layers.

The first electrode AE may be disposed on the sixth insulating layer INS6. The first electrode AE may be connected to the second connecting electrode CNE2 through a third contact hole CH3 defined in the sixth insulating layer INS6. A pixel defining film PDL having an opening PX_OP defined therein for exposing a portion of the first electrode AE may be disposed on the first electrode AE and the sixth insulating layer INS6.

The hole control layer HCL may be disposed on the first electrode AE and the pixel defining film PDL. The hole control layer HCL may include a hole transporting layer and a hole injection layer.

The emissive layer EML may be disposed on the hole control layer HCL. The emissive layer EML may be disposed in an area corresponding to the opening PX_OP. The emissive layer EML may contain an organic material and/or an inorganic material. The emissive layer EML may generate any one of red light, green light, and blue light.

The electron control layer ECL may be disposed on the emissive layer EML and the hole control layer HCL. The electron control layer ECL may include an electron transporting layer and an electron injection layer. The hole control layer HCL and the electron control layer ECL may be commonly disposed in the emissive area PA and the non-emissive area NPA.

The second electrode CE may be disposed on the electron control layer ECL. The second electrode CE may be commonly disposed on the pixels PX. The layer having the light emitting element OLED disposed therein may be defined as the display element layer DP-OLED.

The thin-film encapsulation layer TFE may be disposed on the second electrode CE and may cover or overlap the pixel PX. The thin-film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulating layers and may protect the pixel PX from moisture/oxygen. The second encapsulation layer EN2 may include an organic insulating layer and may protect the pixel PX from foreign matter such as dust particles.

The first voltage may be applied to the first electrode AE through the transistor TR, and the second voltage may be applied to the second electrode CE. Holes and electrons injected into the emissive layer EML may be combined to form excitons, and the light emitting element OLED may emit light as the excitons transition to a ground state.

Figure 6:
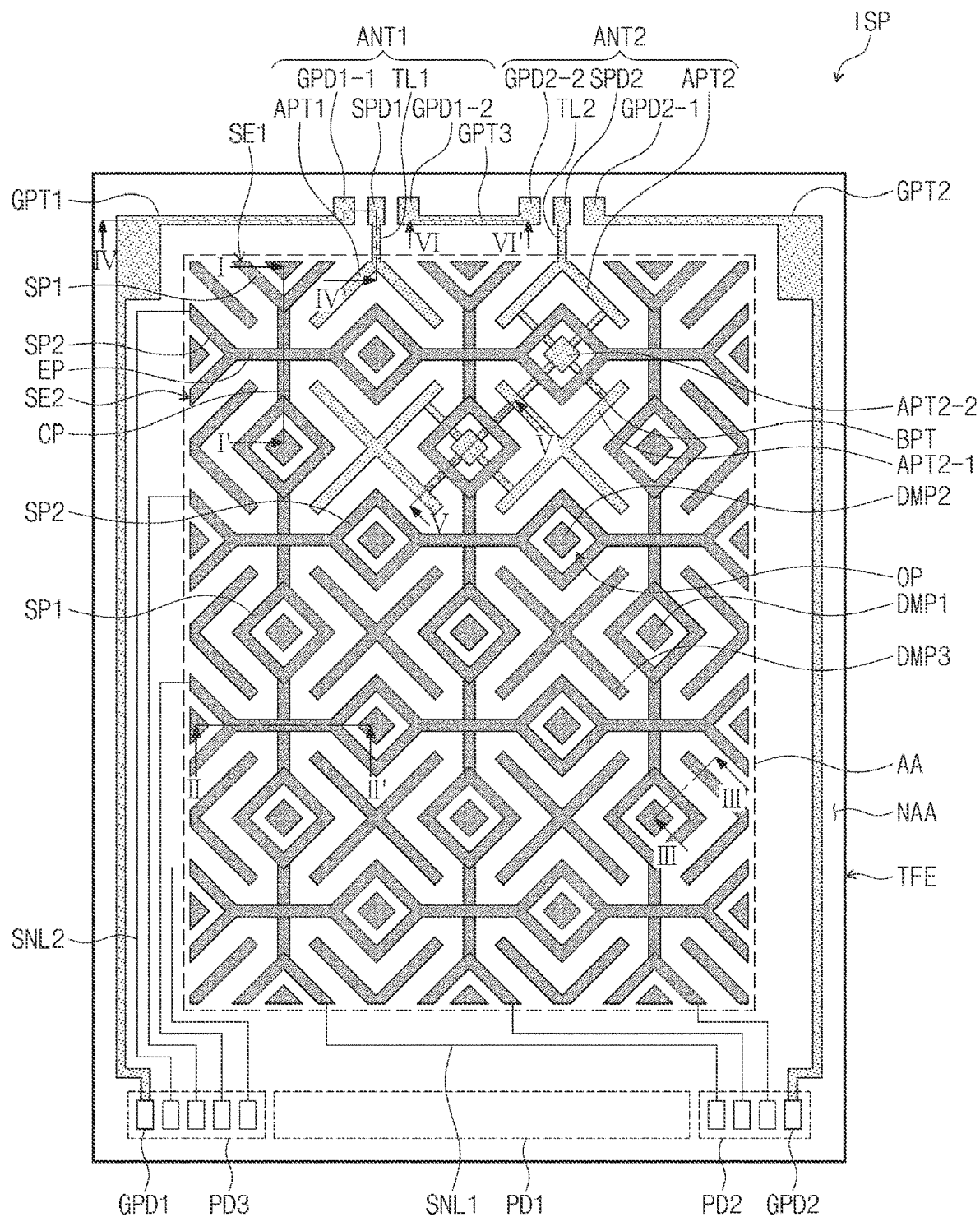
FIG. 6 is a schematic plan view of an input sensing part illustrated in FIG. 2.
Figure 6:
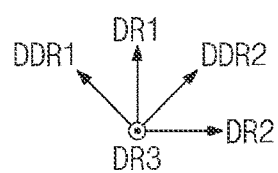

FIG. 6 is a schematic plan view of the input sensing part illustrated in FIG. 2.

Referring to FIG. 6, the input sensing part ISP may include sensing electrodes SE1 and SE2, lines SNL1 and SNL2, second and third pads PD2 and PD3, ground patterns GPT1, GPT2, and GPT3, and antennas ANT1 and ANT2.

The sensing electrodes SE1 and SE2, the lines SNL1 and SNL2, the second and third pads PD2 and PD3, the ground patterns GPT1, GPT2, and GPT3, and the antennas ANT1 and ANT2 may be disposed over the display panel DP. By way of example, the sensing electrodes SE1 and SE2, the lines SNL1 and SNL2, the second and third pads PD2 and PD3, the ground patterns GPT1, GPT2, and GPT3, and the antennas ANT1 and ANT2 may be disposed over the thin-film encapsulation layer TFE.

A planar area of the input sensing part ISP may include an active area AA and an inactive area NAA around the active area AA. The active area AA may overlap the display area DA, and the inactive area NAA may overlap the non-display area NDA.

The sensing electrodes SE1 and SE2 may be disposed in the active area AA, and the second and third pads PD2 and PD3 may be disposed in the inactive area NAA. The second pads PD2 and the third pads PD3 may be adjacent to the lower side of the input sensing part ISP when viewed on the plane. The first pads PD1 may be disposed between the second pads PD2 and the third pads PD3 when viewed on the plane.

The lines SNL1 and SN2 may be connected to ends of the sensing electrodes SE1 and SE2, may extend to the inactive area NAA, and may be connected to the second and third pads PD2 and PD3. Although not illustrated, a sensing controller for controlling the input sensing part ISP may be connected to the second and third pads PD2 and PD3 through a printed circuit board.

The sensing electrodes SE1 and SE2 may include the first sensing electrodes SE1 that extend in the first direction DR1 and that are arranged in the second direction DR2 and the second sensing electrodes SE2 that extend in the second direction DR2 and that are arranged in the first direction DR1. The second sensing electrodes SE2 may cross or intersect the first sensing electrodes SE1 and may be insulated from the first sensing electrodes SE1.

The lines SNL1 and SNL2 may include the first signal lines SNL1 connected to the first sensing electrodes SE1 and the second signal lines SNL2 connected to the second sensing electrodes SE2. The first signal lines SNL1 may extend to the inactive area NAA and may be connected to the second pads PD2. The second signal lines SNL2 may extend to the inactive area NAA and may be connected to the third pads PD3.

The first signal lines SNL1, when viewed on the plane, may be disposed in the inactive area NAA adjacent to the lower side of the active area AA. Furthermore, the second signal lines SNL2, when viewed on the plane, may be disposed in the inactive area NAA adjacent to the left side of the active area AA.

Each of the first sensing electrodes SE1 may include first sensing parts SP1 arranged in the first direction DR1 and connecting patterns CP connecting the first sensing parts SP1. Each of the connecting patterns CP may be disposed between two first sensing parts SP1 adjacent to each other in the first direction DR1 and may connect the two first sensing parts SP1.

Each of the second sensing electrodes SE2 may include second sensing parts SP2 arranged in the second direction DR2 and extending patterns EP extending from the second sensing parts SP2. Each of the extending patterns EP may be disposed between two second sensing parts SP2 adjacent to each other in the second direction DR2 and may extend from the two second sensing parts SP2.

The first sensing parts SP1 and the second sensing parts SP1 may be spaced apart from each other without overlapping each other and may be alternately disposed. Capacitance may be formed by the first sensing parts SP1 and the second sensing parts SP2. The extending patterns EP may extend to cross or intersect the connecting patterns CP when viewed on the plane. The extending patterns EP may be insulated from the connecting patterns CP.

The input sensing part ISP may further include dummy patterns DMP1, DMP2, and DMP3. The dummy patterns DMP1, DMP2, and DMP3 may be disposed between the first sensing electrodes SE1 and the second sensing electrodes SE2 and may be disposed in openings OP defined in the first and second sensing electrodes SE1 and SE2.

The dummy patterns DMP1, DMP2, and DMP3 may include the first dummy patterns DMP1, the second dummy patterns DMP2, and the third dummy patterns DMP3.

The first and second sensing parts SP1 and SP2 may have a rhombic shape, and the openings OP having a rhombic shape may be defined in the first and second sensing parts SP1 and SP2, respectively. However, this is illustrative, and the shapes of the first and second sensing parts SP1 and SP2 and the openings OP are not limited thereto.

The first dummy patterns DMP1 may be disposed in the openings OP defined in the first sensing parts SP1. The second dummy patterns DMP2 may be disposed in the openings OP defined in the second sensing parts SP2. The third dummy patterns DMP3 may be disposed between the first sensing parts SP1 and the second sensing parts SP2. The first, second, and third dummy patterns DMP1, DMP2, and DMP3 may be insulated from the first and second sensing parts SP1 and SP2 and may be disposed in a same layer as the first and second sensing parts SP1 and SP2.

The first and second dummy patterns DMP1 and DMP2 may have a rhombic shape with sides extending in a first diagonal direction DDR1 and sides extending in a second diagonal direction DDR2. The third dummy patterns DMP3 may have the shape of "X". However, this is illustrative, and the shapes of the first, second, and third dummy patterns DMP1, DMP2, and DMP3 are not limited thereto.

The first diagonal direction DDR1 may be defined as a direction intersecting the first and second directions DR1 and DR2 on the plane defined by the first and second directions DR1 and DR2. The second diagonal direction DDR2 may be defined as a direction intersecting the first diagonal direction DDR1 on the plane defined by the first and second directions DR1 and DR2. For example, the first direction DR1 and the second direction DR2 may cross or intersect each other at a right angle, and the first diagonal direction DDR1 and the second diagonal direction DDR2 may cross or intersect each other at a right angle.

The first and second dummy patterns DMP1 and DMP2 may not be disposed in the openings OP defined in some or a number of the first and second sensing parts SP1 and SP2, and the third dummy patterns DMP3 may not be disposed between some or a number of the first and second sensing electrodes SE1 and SE2. Antenna patterns APT1 and APT2 to be described below may be disposed in the openings OP defined in the some or a number of the first and second sensing parts SP1 and SP2 and may be disposed between the some or a number of the first and second sensing electrodes SE1 and SE2.

The ground patterns GPT1, GPT2, and GPT3 may be disposed in the inactive area NAA. The ground patterns GPT1, GPT2, and GPT3 may be disposed to surround the active area AA. The ground patterns GPT1, GPT2, and GPT3 may be disposed in the inactive areas NAA adjacent to the opposite sides of the input sensing part ISP facing away from each other in the second direction DR2 and the inactive area NAA adjacent to the upper side of the input sensing part ISP. The upper side of the input sensing part ISP may be defined as the opposite side to the lower side of the input sensing part ISP on which the second and third pads PD2 and PD3 are disposed.

The ground patterns GPT1, GPT2, and GPT3, when viewed on the plane, may be disposed in the inactive area NAA adjacent to the upper side of the input sensing part ISP and may extend in the second direction DR2. The ground patterns GPT1 and GPT2 may extend in the first direction DR1 in the inactive areas NAA adjacent to the opposite sides of the input sensing part ISP that face away from each other in the second direction DR2.

The ground patterns GPT1, GPT2, and GPT3 may include the first ground pattern GPT1 disposed on the left side with respect to the center of the input sensing part ISP, the second ground pattern GPT2 disposed on the right side with respect to the center of the input sensing part ISP, and the third ground pattern GPT3 disposed in the inactive area NAA adjacent to the upper side of the input sensing part ISP.

The third pads PD3 may include a first ground pad GPD1, and the second pads PD2 may include a second ground pad GPD2. The first ground pad GPD1 may be defined as a pad disposed in the leftmost position among the third pads PD3. The second ground pad GPD2 may be defined as a pad disposed in the rightmost position among the second pads PD2.

The first ground pattern GPT1 may extend in the second direction DR2 in the inactive area NAA adjacent to the upper side of the input sensing part ISP and may extend in the first direction DR1 in the inactive area NAA adjacent to the left side of the input sensing part ISP. The first ground pattern GPT1 may extend toward the lower side of the input sensing part ISP and may be connected to the first ground pad GPD1.

The second ground pattern GPT2 may extend in the second direction DR2 in the inactive area NAA adjacent to the upper side of the input sensing part ISP and may extend in the first direction DR1 in the inactive area NAA adjacent to the right side of the input sensing part ISP. The second ground pattern GPT2 may extend toward the lower side of the input sensing part ISP and may be connected to the second ground pad GPD2.

The third ground pattern GPT3 may extend in the second direction DR2 in the inactive area NAA adjacent to the upper side of the input sensing part ISP. The third ground pattern GPT3 may be disposed between the first ground pattern GPT1 and the second ground pattern GPT2 in the inactive area NAA adjacent to the upper side of the input sensing part ISP.

The antennas ANT1 and ANT2 may be disposed in the active area AA and may extend to the inactive area NAA. The antennas ANT1 and ANT2 may include the first antenna ANT1 and the second antenna ANT2 that are disposed in the inactive area NAA adjacent to the upper side of the input sensing part ISP. The first and second antennas ANT1 and ANT2 may perform a communication function.

The first antenna ANT1 and the second antenna ANT2 may be arranged in the second direction DR2 in the inactive area NAA. The first and second antennas ANT1 and ANT2, the first and second sensing electrodes SE1 and SE2, and the first and second ground patterns GPT1 and GPT2 may be disposed in a same layer.

The first antenna ANT1 may include the first antenna pattern APT1, a first transmission line TL1, a first signal pad SPD1, a ground pad 1-1 (1-1-th ground pad) GPD1-1, and a ground pad 1-2 (1-2-th ground pad) GPD1-2. The ground pad 1-1 GPD1-1 and the ground pad 1-2 GPD1-2 may be defined as ground terminals of the first antenna ANT1. The first antenna pattern APT1 may be disposed in the active area AA and may be insulated from the first and second sensing electrodes SE1 and SE2.

The first antenna pattern APT1 may be disposed between the some or a number of the first and second sensing electrodes SE1 and SE2. For example, the first antenna pattern APT1 may be disposed between the first and second sensing parts SP1 and SP2 adjacent to the upper side of the active area AA. The first antenna pattern APT1 may extend in the first diagonal direction DDR1 and the second diagonal direction DDR2.

The first transmission line TL1, the first signal pad SPD1, the ground pad 1-1 GPD1-1, and the ground pad 1-2 GPD1-2 may be disposed in the inactive area NAA adjacent to the upper side of the input sensing part ISP.

The first signal pad SPD1 may extend from the first antenna pattern APT1 and may be disposed in the inactive area NAA. For example, the first transmission line TL1 extending in the first direction DR1 from the first antenna pattern APT1 may be disposed in the inactive area NAA. The first transmission line TL1 may extend from the first signal pad SPD1. Substantially, the first antenna pattern APT1, the first transmission line TL1, and the first signal pad SPD1 may be disposed in a same layer and may be integral with each other.

The ground pad 1-1 GPD1-1 and the ground pad 1-2 GPD1-2 may be adjacent to the first signal pad SPD1. When viewed on the plane, the ground pad 1-1 GPD1-1 and the ground pad 1-2 GPD1-2 may be larger than the first signal pad SPD1.

The first signal pad SPD1 may be disposed between the ground pad 1-1 GPD1-1 and the ground pad 1-2 GPD1-2. The ground pad 1-1 GPD1-1, the first signal pad SPD1, and the ground pad 1-2 GPD1-2 may be arranged in the second direction DR2. For example, the ground pad 1-1 GPD1-1 may be disposed on the left side of the first signal pad SPD1, and the ground pad 1-2 GPD1-2 may be disposed on the right side of the first signal pad SPD1.

The first ground pattern GPT1, the ground pad 1-1 GPD1-1, the first signal pad SPD1, the ground pad 1-2 GPD1-2, and the first and second sensing parts SP1 and SP2 may be disposed in a same layer.

The ground pad 1-1 GPD1-1 may be connected to the first ground pattern GPT1. For example, the ground pad 1-1 GPD1-1 may extend from the first ground pattern GPT1 and may be integral with the first ground pattern GPT1. However, without being limited thereto, the ground pad 1-1 GPD1-1 may be disposed in a different layer from the first ground pattern GPT1 and may be connected to the first ground pattern GPT1. These structures will be described below in detail with reference to a sectional view of the input sensing part ISP.

The second antenna ANT2 may include the second antenna pattern APT2, a second transmission line TL2, a second signal pad SPD2, a ground pad 2-1 (2-1-th ground pad) GPD2-1, and a ground pad 2-2 (2-2-th ground pad) GPD2-2. The ground pad 2-1 GPD2-1 and the ground pad 2-2 GPD2-2 may be defined as ground terminals of the second antenna ANT2. The second antenna pattern APT2 may be disposed in the active area AA and may be insulated from the first and second sensing electrodes SE1 and SE2.

The second antenna pattern APT2 may be disposed between the some or a number of the first and second sensing electrodes SE1 and SE2. For example, the second antenna pattern APT2 may be disposed between the first and second sensing parts SP1 and SP2 adjacent to the upper side of the active area AA. When viewed on the plane, the second antenna pattern APT2 may not overlap the first antenna pattern APT1.

The second transmission line TL2, the second signal pad SPD2, the ground pad 2-1 GPD2-1, and the ground pad 2-2 GPD2-2 may be disposed in the inactive area NAA adjacent to the upper side of the input sensing part ISP.

The second signal pad SPD2 may extend from the second antenna pattern APT2 and may be disposed in the inactive area NAA. For example, the second transmission line TL2 extending in the first direction DR1 from the second antenna pattern APT2 may be disposed in the inactive area NAA. The second transmission line TL2 may extend from the second signal pad SPD2.

The second antenna pattern APT2 may include antenna patterns 2-1 APT2-1, antenna patterns 2-2 APT2-2, and bridge patterns BPT. The antenna patterns 2-1 APT2-1 may be disposed between the some or a number of the first and second sensing electrodes SE1 and SE2. For example, the antenna patterns 2-1 APT2-1 may be disposed between the first and second sensing parts SP1 and SP2 adjacent to the upper side of the active area AA. The antenna patterns 2-1 APT2-1 may extend in the first diagonal direction DDR1 and the second diagonal direction DDR2.

The antenna patterns 2-2 APT2-2 may be disposed in the openings OP defined in the some or a number of the first and second sensing electrodes SE1 and SE2. For example, the antenna patterns 2-2 APT2-2 may be disposed in the openings OP defined in the first and second sensing parts SP1 and SP2 adjacent to the upper side of the active area AA.

The antenna patterns 2-1 APT2-1, the antenna patterns 2-2 APT2-2, the second transmission line TL2, and the second signal pad SPD2 may be disposed in a same layer. The second transmission line TL2 may extend from the antenna pattern 2-1 APT2-1 adjacent to the upper side of the active area AA. The second transmission line TL2, the second signal pad SPD2, and the antenna pattern 2-1 APT2-1 adjacent to the upper side of the active area AA may be integral with each other.

The bridge patterns BPT may be disposed in a different layer from the antenna patterns 2-1 APT2-1 and the antenna patterns 2-2 APT2-2 and may connect the antenna patterns 2-1 APT2-1 and the antenna patterns 2-2 APT2-2. This configuration will be described below in detail with reference to a sectional view of the input sensing part ISP.

When viewed on the plane, the bridge patterns BPT may cross or intersect the some or a number of the first and second sensing parts SP1 and SP2 and may extend in the first diagonal direction DDR1 or the second diagonal direction DDR2. The bridge patterns BPT may be insulated from the first and second sensing parts SP1 and SP2.

The ground pad 2-1 GPD2-1 and the ground pad 2-2 GPD2-2 may be adjacent to the second signal pad SPD2. When viewed on the plane, the ground pad 2-1 GPD2-1 and the ground pad 2-2 GPD2-2 may be larger than the second signal pad SPD2.

The second signal pad SPD2 may be disposed between the ground pad 2-1 GPD2-1 and the ground pad 2-2 GPD2-2. The ground pad 2-1 GPD2-1, the second signal pad SPD2, and the ground pad 2-2 GPD2-2 may be arranged in the second direction DR2. For example, the ground pad 2-1 GPD2-1 may be disposed on the right side of the second signal pad SPD2, and the ground pad 2-2 GPD2-2 may be disposed on the left side of the second signal pad SPD2.

The second ground pattern GPT2, the ground pad 2-1 GPD2-1, the second signal pad SPD2, the ground pad 2-2 GPD2-2, and the first and second sensing parts SP1 and SP2 may be disposed in a same layer.

The ground pad 2-1 GPD2-1 may be connected to the second ground pattern GPT2. For example, the ground pad 2-1 GPD2-1 may extend from the second ground pattern GPT2 and may be integral with the second ground pattern GPT2. However, without being limited thereto, the ground pad 2-1 GPD2-1 may be disposed in a different layer from the second ground pattern GPT2 and may be connected to the second ground pattern GPT2.

The third ground pattern GPT3 may be disposed between the ground pad 1-2 GPD1-2 and the ground pad 2-2 GPD2-2. The ground pad 1-2 GPD1-2 and the ground pad 2-2 GPD2-2 may be connected to the third ground pattern GPT3. For example, the ground pad 1-2 GPD1-2 and the ground pad 2-2 GPD2-2 may extend from the third ground pattern GPT3 and may be integral with the third ground pattern GPT3. However, without being limited thereto, the ground pad 1-2 GPD1-2 and the ground pad 2-2 GPD2-2 may be disposed in a different layer from the third ground pattern GPT3 and may be connected to the third ground pattern GPT3.

According to the above configuration, the first, second, and third ground patterns GPT1, GPT2, and GPT3 may be connected not only to the first and second ground pads GPD1 and GPD2 but also to the ground terminals of the first and second antenna ANT1 and ANT2.

The first and second sensing electrodes SE1 and SE2 and the antennas ANT1 and ANT2 may be formed of silver, gold, copper, aluminum, platinum, palladium, chromium, titanium, tungsten, niobium, tantalum, vanadium, iron, manganese, cobalt, nickel, zinc, tin, molybdenum, or an alloy thereof.

Figure 7:
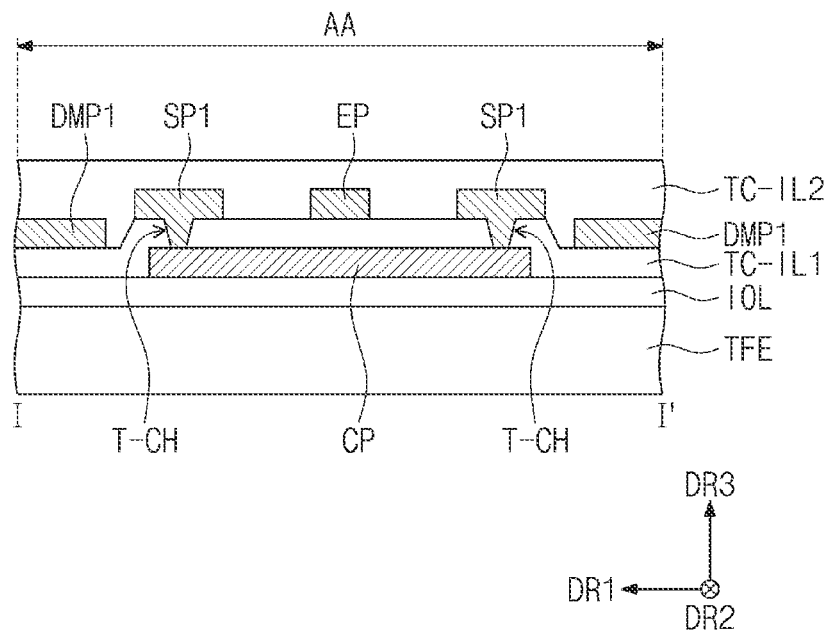
FIG. 7 is a schematic cross-sectional view taken along line I-I' illustrated in FIG. 6.
Figure 8:
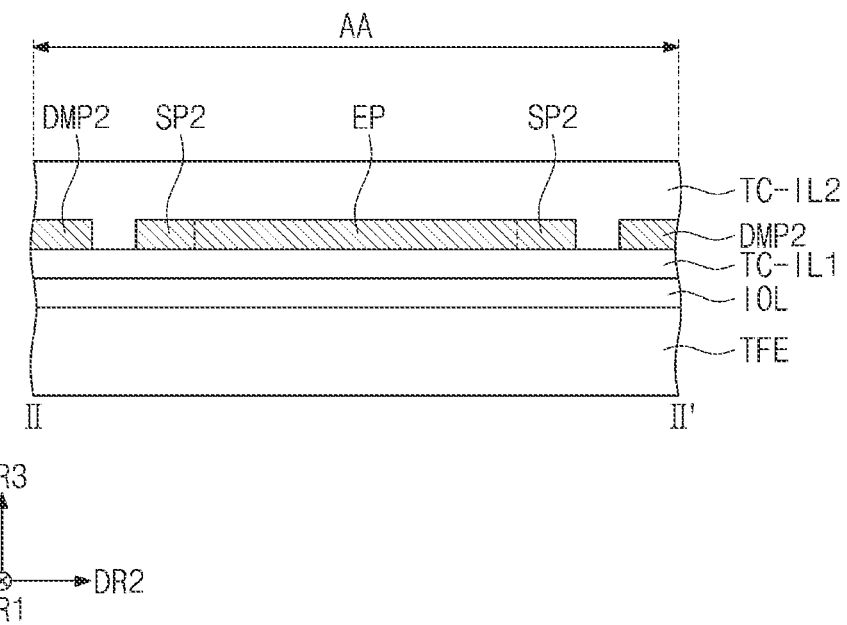
FIG. 8 is a schematic cross-sectional view taken along line II-II' illustrated in FIG. 6.
Figure 9:
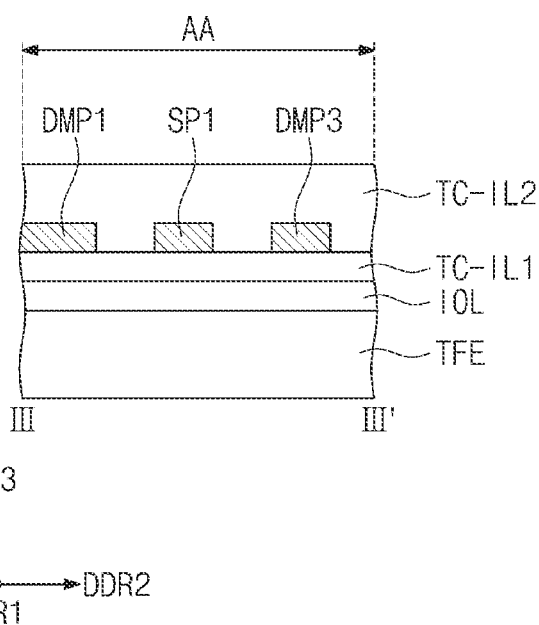
FIG. 9 is a schematic cross-sectional view taken along line III-III' illustrated in FIG. 6.

FIG. 7 is a schematic cross-sectional view taken along line I-I' illustrated in FIG. 6. FIG. 8 is a schematic cross-sectional view taken along line II-II' illustrated in FIG. 6. FIG. 9 is a schematic cross-sectional view taken along line III-III' illustrated in FIG. 6.

Referring to FIGS. 7, 8, and 9, an insulating layer IOL may be disposed on the thin-film encapsulation layer TFE. The insulating layer IOL may include an inorganic insulating layer. At least one insulating layer IOL may be provided on the thin-film encapsulation layer TFE. For example, two or more inorganic insulating layers IOL may be sequentially stacked each other on the thin-film encapsulation layer TFE.

The connecting pattern CP may be disposed on the insulating layer IOL. A first insulating layer TC-IL1 may be disposed on the connecting pattern CP and the insulating layer IOL. The first insulating layer TC-IL1 may be disposed on the insulating layer IOL to cover or overlap the connecting pattern CP. The first insulating layer TC-IL1 may include an inorganic insulating layer or an organic insulating layer.

The first sensing parts SP1 may be disposed on the first insulating layer TC-IL1. The connecting pattern CP may be connected to the first sensing parts SP1 through contact holes T-CH defined in the first insulating layer TC-IL1.

The second sensing parts SP2 and the extending pattern EP may be disposed on the first insulating layer TC-IL1. The extending pattern EP may extend from one second sensing part SP2 to another second sensing part SP2. The extending pattern EP may be integral with the second sensing parts SP2.

The first, second, and third dummy patterns DMP1, DMP2, and DMP3 may be disposed on the first insulating layer TC-IL1. Accordingly, the first, second, and third dummy patterns DMP1, DMP2, and DMP3 may be disposed in a same layer as the first and second sensing parts SP1 and SP2.

A second insulating layer TC-IL2 may be disposed on the first and second sensing parts SP1 and SP2, the extending pattern EP, the first, second, and third dummy patterns DMP1, DMP2, and DMP3, and the first insulating layer TC-IL1. The second insulating layer TC-IL2 may be disposed on the first insulating layer TC-IL1 to cover or overlap the first and second sensing parts SP1 and SP2, the extending pattern EP, and the first, second, and third dummy patterns DMP1, DMP2, and DMP3. The second insulating layer TC-IL2 may include an organic insulating layer.

Figure 10:
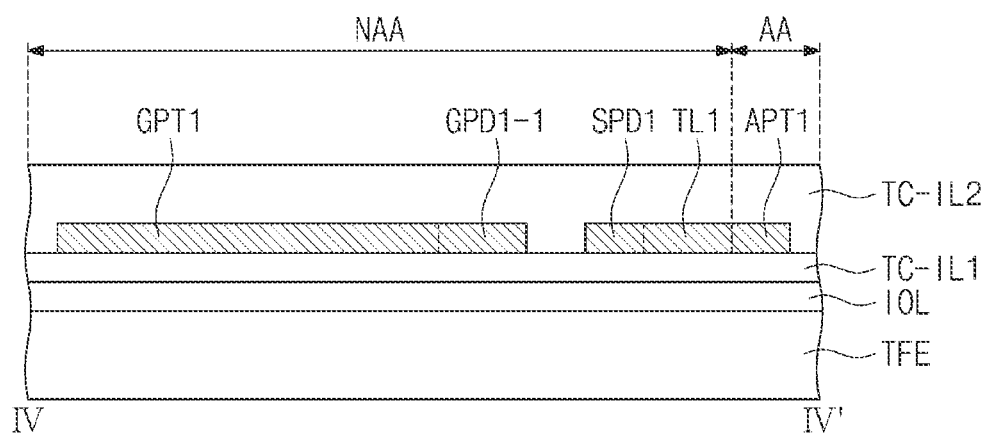
FIG. 10 is a schematic cross-sectional view taken along line IV-IV' illustrated in FIG. 6.
Figure 11:
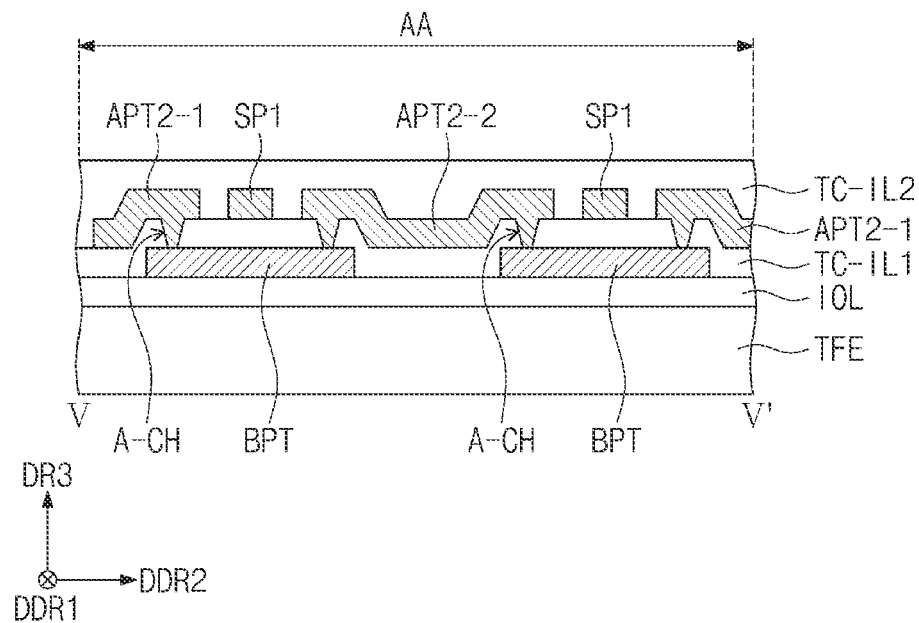
FIG. 11 is a schematic cross-sectional view taken along line V-V' illustrated in FIG. 6.
Figure 12:
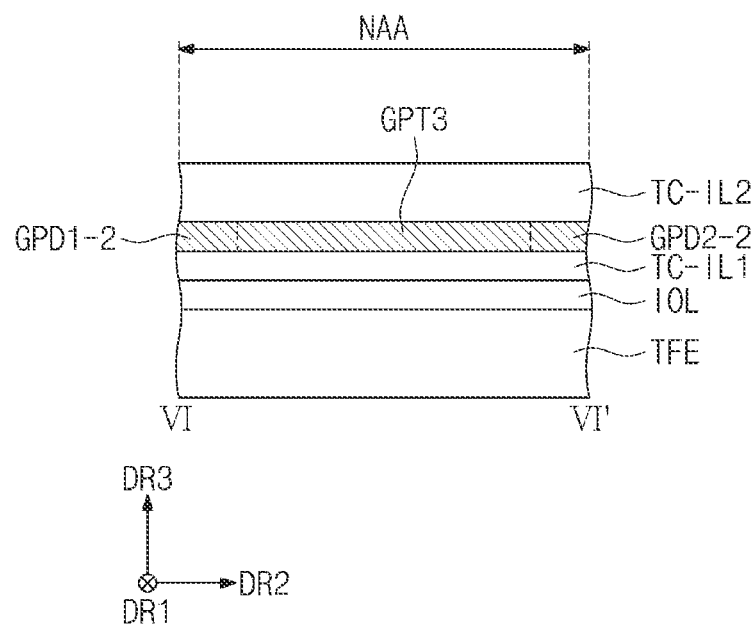
FIG. 12 is a schematic cross-sectional view taken along line VI-VI' illustrated in FIG. 6.

FIG. 10 is a schematic cross-sectional view taken along line IV-IV' illustrated in FIG. 6. FIG. 11 is a schematic cross-sectional view taken along line V-V' illustrated in FIG. 6. FIG. 12 is a schematic cross-sectional view taken along line VI-VI' illustrated in FIG. 6.

Referring to FIG. 10, the first antenna pattern APT1, the first transmission line TL1, the first signal pad SPD1, the ground pad 1-1 GPD1-1, and the first ground pattern GPT1 may be disposed on the first insulating layer TC-IL1. Accordingly, the first antenna pattern APT1, the first transmission line TL1, the first signal pad SPD1, the ground pad 1-1 GPD1-1, and the first ground pattern GPT1 may be disposed in a same layer.

The second insulating layer TC-IL2 may be disposed on the first insulating layer TC-IL1 to cover or overlap the first antenna pattern APT1, the first transmission line TL1, the first signal pad SPD1, the ground pad 1-1 GPD1-1, and the first ground pattern GPT1.

On the first insulating layer TC-IL1, the ground pad 1-1 GPD1-1 may extend from the first ground pattern GPT1 and may be integral with the first ground pattern GPT1. Furthermore, the first signal pad SPD1, the first transmission line TL1, and the first antenna pattern APT1 may be integral on the first insulating layer TC-IL1.

Although not illustrated, the second transmission line TL2, the second signal pad SPD2, the ground pad 2-1 GPD2-1, the ground pad 2-2 GPD2-2, and the second ground pattern GPT2 may also be disposed on the first insulating layer TC-IL1. On the first insulating layer TC-IL1, the ground pad 2-1 GPD2-1 may extend from the second ground pattern GPT2 and may be integral with the second ground pattern GPT2. Furthermore, the second transmission line TL2 and the second signal pad SPD2 may be integral on the first insulating layer TC-IL1.

Referring to FIG. 11, the bridge patterns BPT may be disposed on the insulating layer IOL. Accordingly, the bridge patterns BPT may be disposed in a same layer as the above-described connecting patterns CP.

The first insulating layer TC-IL1 may be disposed on the insulating layer IOL to cover or overlap the bridge patterns BPT. The antenna patterns 2-1 APT2-1 and the antenna pattern 2-2 APT2-2 may be disposed on the first insulating layer TC-IL1. Accordingly, the antenna patterns 2-1 APT2-1 and the antenna pattern 2-2 APT2-2 may be disposed in a same layer as the second signal pad SPD2, the ground pad 2-1 GPD2-1, and the ground pad 2-2 GPD2-2. The second insulating layer TC-IL2 may be disposed on the first insulating layer TC-IL1 to cover or overlap the antenna patterns 2-1 APT2-1 and the antenna pattern 2-2 APT2-2.

The antenna patterns 2-1 APT2-1 and the antenna pattern 2-2 APT2-2 may be connected to the bridge patterns BPT through contact holes A-CH defined in the first insulating layer TC-IL1. The antenna patterns 2-1 APT2-1 may be connected to the antenna pattern 2-2 APT2-2 through the bridge patterns BPT.

Referring to FIG. 12, the ground pad 1-2 GPD1-2, the ground pad 2-2 GPD2-2, and the third ground pattern GPT3 may be disposed on the first insulating layer TC-IL1. Accordingly, the ground pad 1-2 GPD1-2, the ground pad 2-2 GPD2-2, and the third ground pattern GPT3 may be disposed in a same layer.

On the first insulating layer TC-IL1, the ground pad 1-2 GPD1-2 and the ground pad 2-2 GPD2-2 may extend from the third ground pattern GPT3 and may be integral with the third ground pattern GPT3. The second insulating layer TC-IL2 may be disposed on the first insulating layer TC-IL1 to cover or overlap the ground pad 1-2 GPD1-2, the ground pad 2-2 GPD2-2, and the third ground pattern GPT3.

Figure 13:
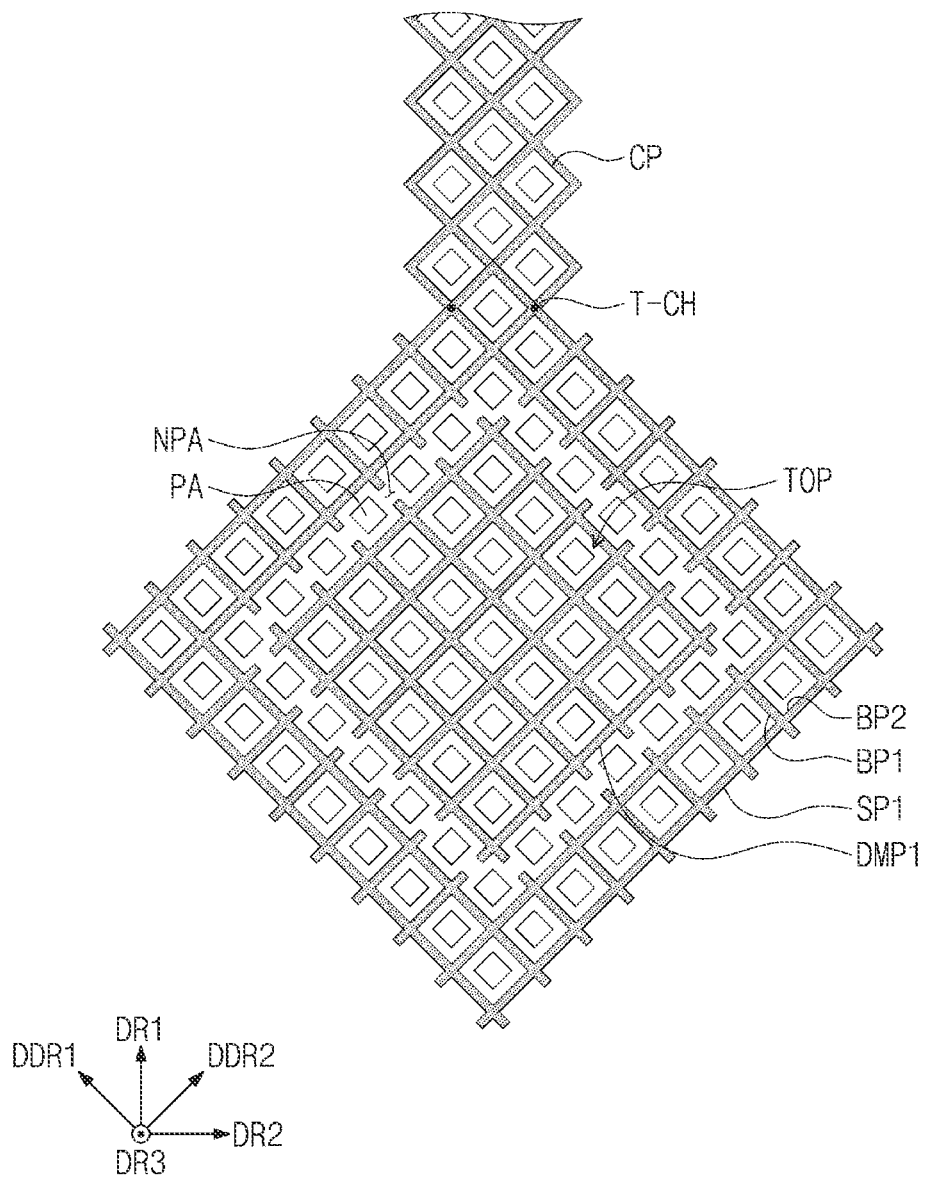
FIG. 13 is an enlarged view of any one first sensing part and any one first dummy pattern illustrated in FIG. 6.

FIG. 13 is an enlarged view of any one first sensing part and any one first dummy pattern illustrated in FIG. 6.

Referring to FIG. 13, the first sensing part SP1, the connecting pattern CP, and the first dummy pattern DMP1 may have a mesh shape. Although not illustrated, the other first sensing parts SP1, the other first dummy patterns DMP1, the second sensing parts SP2, the extending patterns EP, the second and third dummy patterns DMP2 and DMP3, and the first and second antenna patterns APT1 and APT2 disposed in the active area AA, which are illustrated in FIG. 6, may also have a mesh shape.

To have a mesh shape, the first sensing part SP1, the connecting pattern CP, and the first dummy pattern DMP1 may each include first branches BP1 extending in the first diagonal direction DDR1 and second branches BP2 extending in the second diagonal direction DDR2.

The first branches BP1 and the second branches BP2 of the first sensing part SP1 may cross or intersect each other and may be integral with each other. The first branches BP1 and the second branches BP2 of the connecting pattern CP may cross or intersect each other and may be integral with each other. The first branches BP1 and the second branches BP2 of the first dummy pattern DMP1 may cross or intersect each other and may be integral with each other. The first and second branches BP1 and BP2 of the first sensing part SP1 may be separated from the first and second branches BP1 and BP2 of the first dummy pattern DMP1.

Touch openings TOP having a rhombic shape may be defined by the first branches BP1 and the second branches BP2. The emissive area PA illustrated in FIG. 5 may be disposed in each of the touch openings TOP. As described above, the light emitting element OLED may be disposed in the emissive area PA. Light generated from the light emitting elements OLED may be output through the emissive areas PA.

The first sensing part SP1, the connecting pattern CP, and the first dummy pattern DMP1 may be disposed in the non-emissive area NPA. For example, the first branches BP1 and the second branches BP2 may be disposed in the non-emissive area NPA. The first branches BP1 and the second branches BP2 may not be disposed in the emissive areas PA.

As the first and second branches BP1 and BP2 are disposed in the non-emissive area NPA, light generated from the light emitting elements OLED may be normally output without being affected by the first sensing part SP1, the connecting pattern CP, and the first dummy pattern DMP1.

The connecting pattern CP may be connected to the first sensing part SP1 through contact holes T-CH defined at some or a number of the intersections in the mesh shape of the first sensing part SP1. The intersections in the mesh shape may be defined as the intersections of the first branches BP1 and the second branches BP2.

Figure 14:
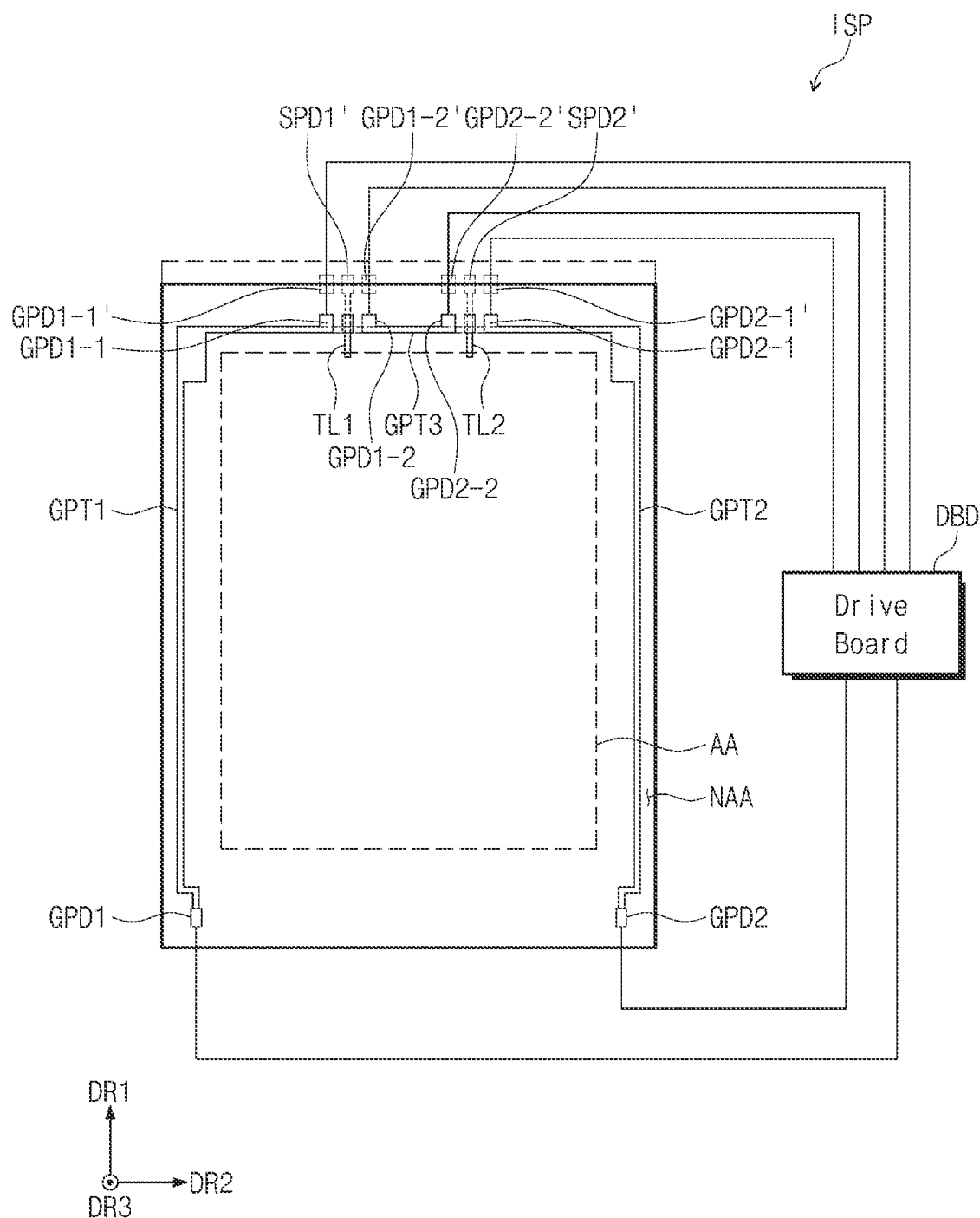
FIG. 14 is a view illustrating a drive board connected to a first ground pad, a second ground pad, a ground pad 1-1, a ground pad 1-2, a ground pad 2-1, and a ground pad 2-2 illustrated in FIG. 6.

FIG. 14 is a view illustrating a drive board connected to the first ground pad, the second ground pad, the ground pad 1-1, the ground pad 1-2, the ground pad 2-1, and the ground pad 2-2 illustrated in FIG. 6.

In FIG. 14, the first and second sensing electrodes SE1 and SE2, the first and second signal lines SNL1 and SNL2, and the second and third pads PD2 and PD3 connected to the first and second signal lines SNL1 and SNL2 are omitted. A first signal pad SPD1', a second signal pad SPD2', a ground pad 1-1 GPD1-1', a ground pad 1-2 GPD1-2', a ground pad 2-1 GPD2-1', and a ground pad 2-2 GPD2-2' are illustrated by dotted lines so as to be distinguished from the first signal pad SPD1, the second signal pad SPD2, the ground pad 1-1 GPD1-1, the ground pad 1-2 GPD1-2, the ground pad 2-1 GPD2-1, and the ground pad 2-2 GPD2-2.

Referring to FIG. 14, the drive board DBD may be connected to the first ground pad GPD1, the second ground pad GPD2, the ground pad 1-1 GPD1-1, the ground pad 1-2 GPD1-2, the ground pad 2-1 GPD2-1, and the ground pad 2-2 GPD2-2. The drive board DBD may include the above-described sensing controller.

The drive board DBD may commonly apply a ground voltage to the first ground pad GPD1, the second ground pad GPD2, the ground pad 1-1 GPD1-1, the ground pad 1-2 GPD1-2, the ground pad 2-1 GPD2-1, and the ground pad 2-2 GPD2-2.

The first, second, and third ground patterns GPT1, GPT2, and GPT3 may not be connected to the antennas ANT1 and ANT2. The first signal pad SPD1', the second signal pad SPD2', the ground pad 1-1 GPD1-1', the ground pad 1-2 GPD1-2', the ground pad 2-1 GPD2-1', and the ground pad 2-2 GPD2-2' may be disposed in the inactive area NAA so as to be spaced apart from the first, second, and third ground patterns GPT1, GPT2, and GPT3 in the first direction DR1. Furthermore, as illustrated by dotted lines, the first ground pattern GPT1 and the second ground pattern GPT2 may be integral with and connected with each other, and the second ground pattern GPT2 and the third ground pattern GPT3 may be integral with and connected with each other.

As illustrated in FIG. 14, the upper side of the input sensing part ISP has to extend above the upper side of the input sensing part ISP illustrated in FIG. 6 to secure a region for arrangement of the first signal pad SPD1', the second signal pad SPD2', the ground pad 1-1 GPD1-1', the ground pad 1-2 GPD1-2', the ground pad 2-1 GPD2-1', and the ground pad 2-2 GPD2-2'. Accordingly, the inactive area NAA may be increased.

Furthermore, the ground voltage may be applied to the first, second, and third ground patterns GPT1, GPT2, and GPT3, and the ground voltage may be applied to the ground pad 1-1 GPD1-1', the ground pad 1-2 GPD1-2', the ground pad 2-1 GPD2-1', and the ground pad 2-2 GPD2-2' that are separated from the ground patterns GPT1, GPT2, and GPT3.

A potential difference may occur between the ground patterns GPT1, GPT2, and GPT3 and the ground pads GPD1-1', GPD1-2', GPD2-1', and GPD2-2' as the ground patterns GPT1, GPT2, and GPT3 and the ground pads GPD1-1', GPD1-2', GPD2-1', and GPD2-2' are separated from each other.

In case that a configuration in which the ground patterns GPT1, GPT2, and GPT3 are integral with is defined as a common ground pattern, the common ground pattern (the dotted-portion extending in the second direction DR2) in the upper inactive area NAA may extend to cross or intersect the first and second transmission lines TL1 and TL2. Accordingly, the common ground pattern and the first and second transmission lines TL1 and TL2 may be disposed in a same layer and therefore may be short-circuited.

To prevent such a phenomenon, the common ground pattern has to be divided at the intersections of the common ground pattern and the first and second transmission lines TL1 and TL2, and the common ground patterns divided from one another have to be connected by separate bridges disposed in a different layer. Accordingly, the separate bridges may be additionally used.

In an embodiment, the first, second, and third ground patterns GPT1, GPT2, and GPT3 may be connected to the ground terminals GPD1-1, GPD1-2, GPD2-1, and GPD 2-2 of the first and second antennas ANT1 and ANT2, and thus the inactive area NAA for the arrangement of the first, second, and third ground patterns GPT1, GPT2, and GPT3 and the first and second antennas ANT1 and ANT2 may be reduced.

Furthermore, a common voltage may be commonly applied to the ground patterns GPT1, GPT2, and GPT3 and the ground terminals GPD1-1, GPD1-2, GPD2-1, and GPD2-2 of the antennas ANT1 and ANT2 that are connected with each other, and thus the above-described potential difference may not occur.

The ground patterns GPT1, GPT2, and GPT3 may be integral with and connected with the ground pads GPD1-1, GPD1-2, GPD2-1, and GPD2-2, and thus the above-described bridges may not be required.

Figure 15:
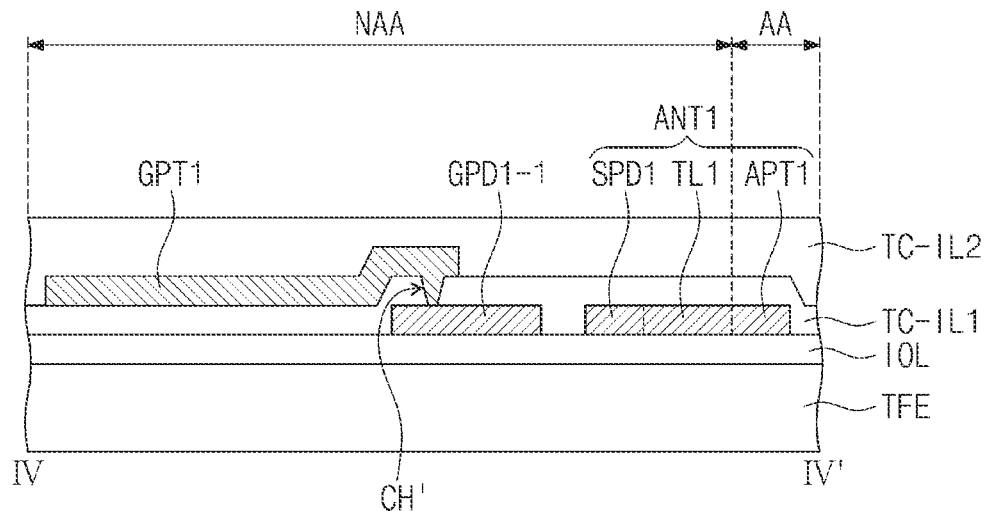
FIGS. 15 and 16 are views illustrating configurations of first and second antennas according to an embodiment.
Figure 16:
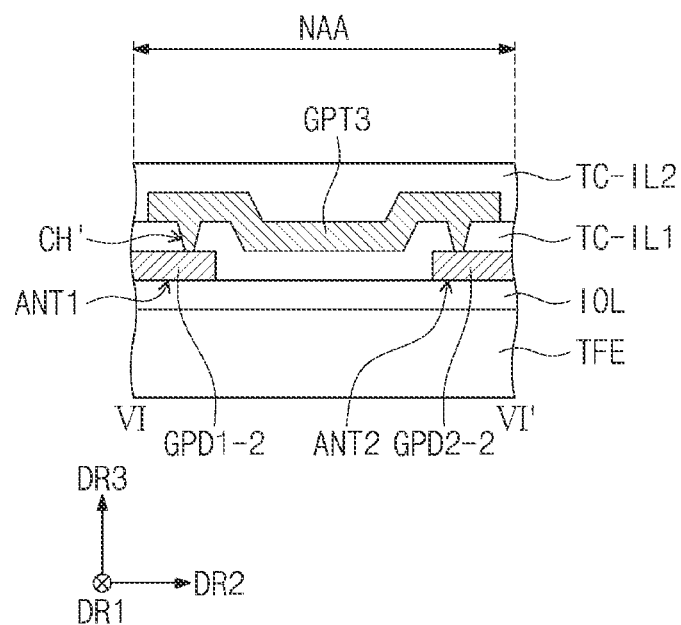

FIGS. 15 and 16 are views illustrating configurations of first and second antennas according to an embodiment.

FIG. 15 is a schematic cross-sectional view corresponding to FIG. 10, and FIG. 16 is a schematic cross-sectional view corresponding to FIG. 12.

Referring to FIG. 15, the first antenna ANT1 may be disposed in a different layer from the first ground pattern GPT1. For example, a ground pad 1-1 GPD1-1, a first signal pad SPD1, and a first transmission line TL1 may be disposed on the insulating layer IOL. Although not illustrated, a ground pad 1-2 GPD1-2 and a first antenna pattern APT1 may also be disposed on the insulating layer IOL.

The first insulating layer TC-IL1 may be disposed on the insulating layer IOL to cover or overlap the ground pad 1-1 GPD1-1, the first signal pad SPD1, and the first transmission line TL1. The first ground pattern GPT1 may be disposed on the first insulating layer TC-IL1.

The ground pad 1-1 GPD1-1 may be connected to the first ground pattern GPT1 through a contact hole CH' defined in the first insulating layer TC-IL1. For example, the ground pad 1-1 GPD1-1 may be disposed in a different layer from the first ground pattern GPT1 and may be connected to the first ground pattern GPT1.

Although not illustrated, the second antenna ANT2 may have substantially the same structure as the first antenna ANT1. For example, a ground pad 2-1 GPD2-1, a ground pad 2-2 GPD2-2, a second signal pad SPD2, a second transmission line TL2, and a second antenna pattern APT2 may be disposed on the insulating layer IOL.

Similar to the ground pad 1-1 GPD1-1, the ground pad 2-1 GPD2-1 may be connected to the second ground pattern GPT2 through a contact hole CH' defined in the first insulating layer TC-IL1. For example, the ground pad 2-1 GPD2-1 may be disposed in a different layer from the second ground pattern GPT2 and may be connected to the second ground pattern GPT2.

Referring to FIG. 16, the ground pad 1-2 GPD1-2 and the ground pad 2-2 GPD2-2 may be disposed on the insulating layer IOL. The first insulating layer TC-IL1 may be disposed on the insulating layer IOL to cover or overlap the ground pad 1-2 GPD1-2 and the ground pad 2-2 GPD2-2. The third ground pattern GPT3 may be disposed on the first insulating layer TC-IL1.

The ground pad 1-2 GPD1-2 and the ground pad 2-2 GPD2-2 may be connected to the third ground pattern GPT3 through contact holes CH' defined in the first insulating layer TC-IL1. For example, the ground pad 1-2 GPD1-2 and the ground pad 2-2 GPD2-2 may be disposed in a different layer from the third ground pattern GPT3 and may be connected to the third ground pattern GPT3.

Figure 17:
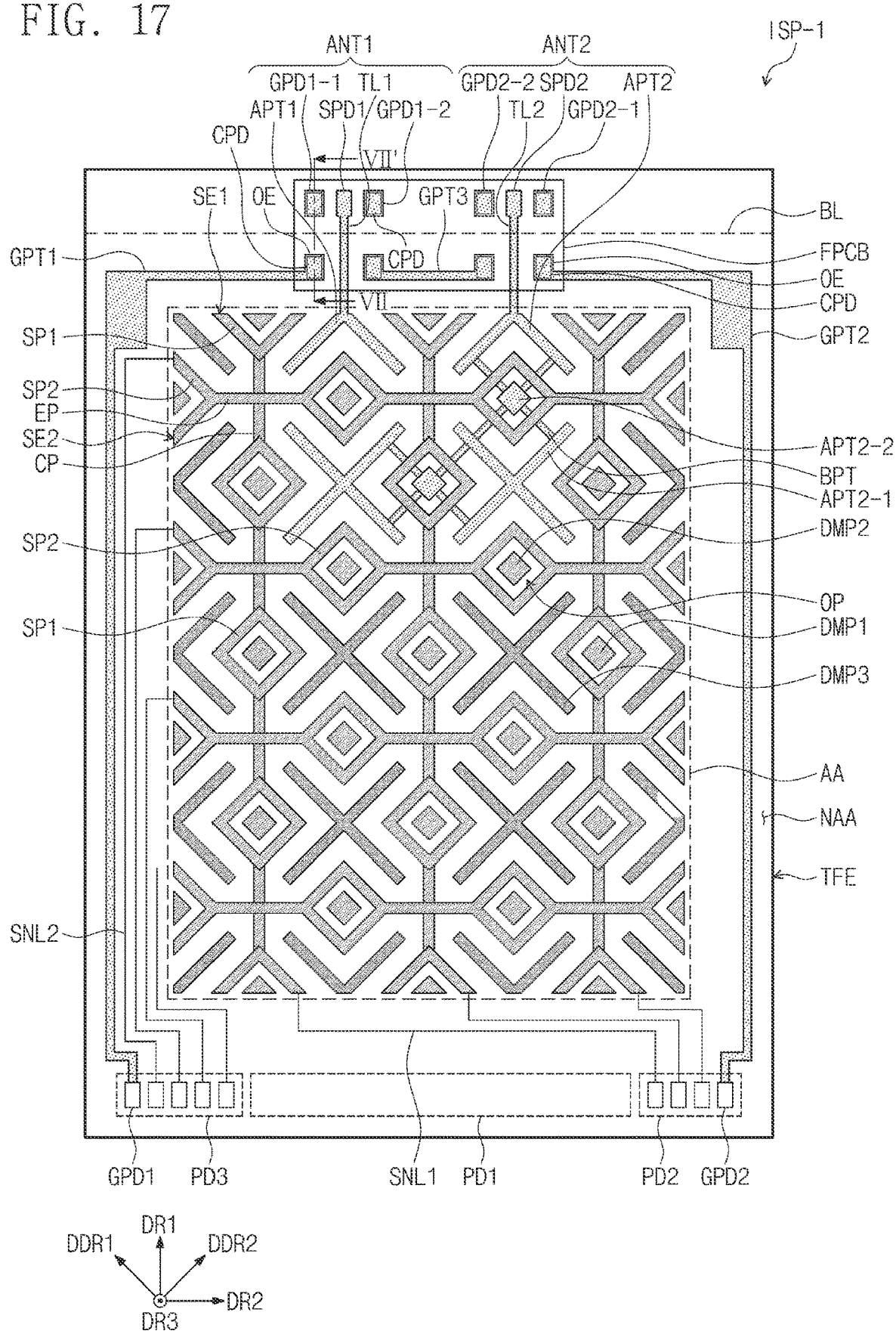
FIG. 17 is a view illustrating a configuration of an input sensing part according to an embodiment.

FIG. 17 is a view illustrating a configuration of an input sensing part according to an embodiment.

FIG. 17 is a schematic plan view corresponding to FIG. 6. The following description will be focused on the difference between the input sensing part ISP illustrated in FIG. 6 and the input sensing part ISP-1 illustrated in FIG. 17.

Referring to FIG. 17, the input sensing part ISP-1 may further include a flexible circuit board FPCB and connecting pads CPD. First and second antennas ANT1 and ANT2 of the input sensing part ISP-1 may be spaced apart from first, second, and third ground patterns GPT1, GPT2, and GPT3. Ground terminals of the first and second antennas ANT1 and ANT2 may be connected to the first, second, and third ground patterns GPT1, GPT2, and GPT3 through the flexible circuit board FPCB.

A ground pad 1-1 GPD1-1 may be spaced apart from one end or an end OE of the first ground pattern GPT1 in the first direction DR1. An opposite end of the first ground pattern GPT1 may be connected to a first ground pad GPD1. A ground pad 1-2 GPD1-2 may be spaced apart from one end or an end of the third ground pattern GPT3 in the first direction DR1.

A ground pad 2-1 GPD2-1 may be spaced apart from one end or an end OE of the second ground pattern GPT2 in the first direction DR1. An opposite end of the second ground pattern GPT2 may be connected to a second ground pad GPD2. A ground pad 2-2 GPD2-2 may be spaced apart from an opposite end of the third ground pattern GPT3 in the first direction DR1.

A bending line BL extending in the second direction DR2 between the one end or an end OE of the first ground pattern GPT1 and the ground pad 1-1 GPD1-1 may be defined. The bending line BL may extend in the second direction DR2 through between the ground pad 1-2 GPD1-2 and the one end or an end of the third ground pattern GPT3, between the ground pad 2-2 GPD2-2 and the opposite end of the third ground pattern GPT3, and between the ground pad 2-1 GPD2-1 and the one end or an end OE of the second ground pattern GPT2.

A first signal pad SPD1 and a second signal pad SPD2 may be adjacent to the upper side of the input sensing part ISP-1. The first signal pad SPD1 and the second signal pad SPD2 may be disposed between the upper side of the input sensing part ISP-1 and the bending line BL. First and second transmission lines TL1 and TL2 may cross or intersect the bending line BL and may extend toward the first and second signal pads SPD1 and SPD2.

The flexible circuit board FPCB may be disposed over the first signal pad SPD1, the second signal pad SPD2, the ground pad 1-1 GPD1-1, the ground pad 1-2 GPD1-2, the ground pad 2-1 GPD2-1, the ground pad 2-2 GPD2-2, the one end or an end OE of the first ground pattern GPT1, the one end or an end OE of the second ground pattern GPT2, and the third ground pattern GPT3.

The connecting pads CPD may be disposed on the flexible circuit board FPCB. The connecting pads CPD may be connected to the ground pad 1-1 GPD1-1, the ground pad 1-2 GPD1-2, the ground pad 2-1 GPD2-1, the ground pad 2-2 GPD2-2, the one end or an end OE of the first ground pattern GPT1, the one end or an end OE of the second ground pattern GPT2, and the opposite ends of the third ground pattern GPT3.

The flexible circuit board FPCB may be connected to the ground pad 1-1 GPD1-1, the ground pad 1-2 GPD1-2, the ground pad 2-1 GPD2-1, the ground pad 2-2 GPD2-2, the one end or an end OE of the first ground pattern GPT1, the one end or an end OE of the second ground pattern GPT2, and the opposite ends of the third ground pattern GPT3 by the connecting pads CPD.

Figure 18:
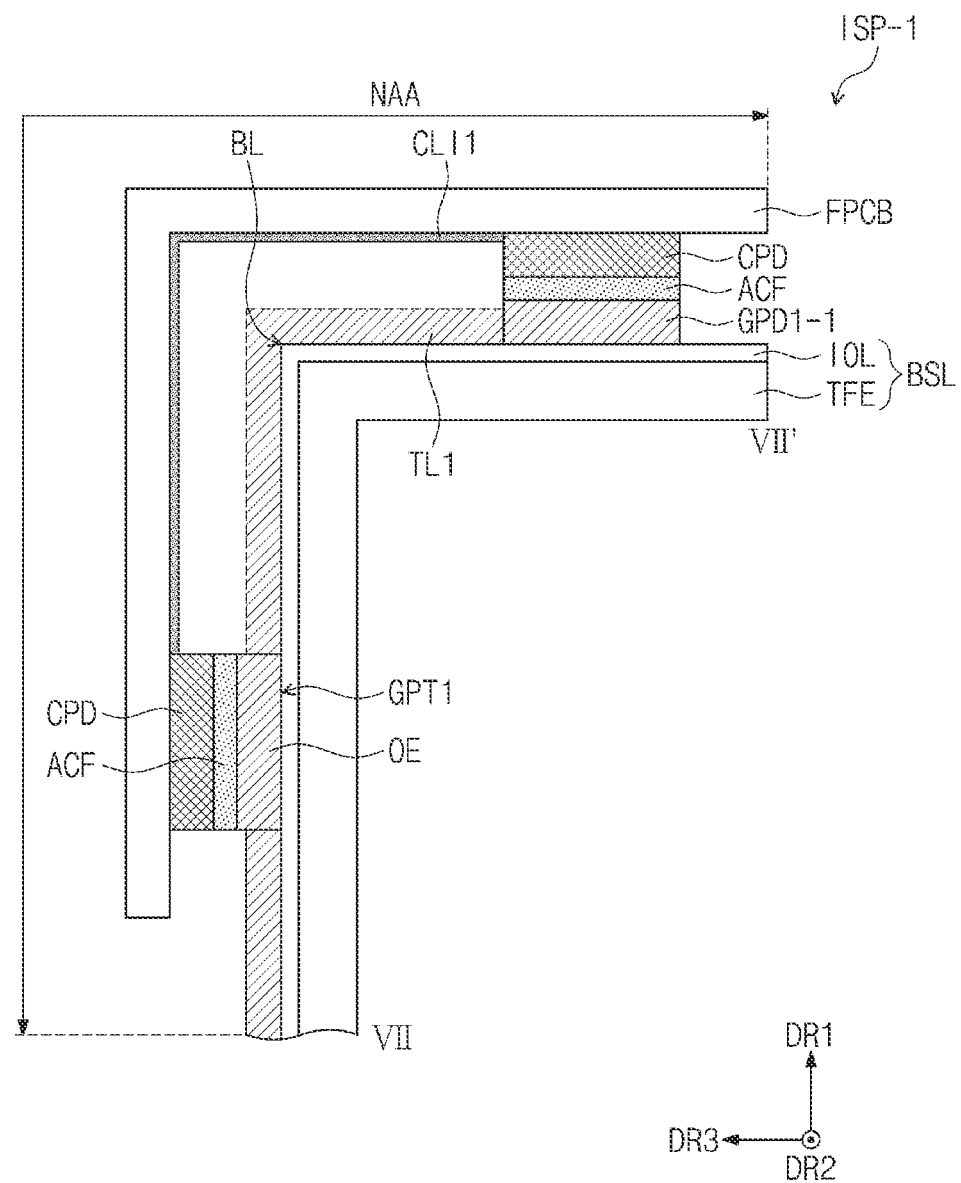
FIG. 18 is a schematic cross-sectional view taken along line VII-VII' illustrated in FIG. 17.

FIG. 18 is a schematic cross-sectional view taken along line VII-VII' illustrated in FIG. 17.

In FIG. 18, the first transmission line TL1 is illustrated by dotted lines.

Referring to FIG. 18, a thin-film encapsulation layer TFE and an insulating layer IOL may be defined as a base layer BSL. An active area AA and an inactive area NAA may be defined in the base layer BSL. For convenience of description, in FIG. 18, first and second insulating layers TC-IL1 and TC-IL2 are omitted, and components disposed on the insulating layer IOL are illustrated.

The ground pad 1-1 GPD1-1 and the first ground pattern GPT1 may be disposed on the base layer BSL. The flexible circuit board FPCB may be disposed over the base layer BSL. The flexible circuit board FPCB may be connected to the ground pad 1-1 GPD1-1 and the first ground pattern GPT1.

By way of example, connecting pads CPD may be disposed on the lower surface of the flexible circuit board FPCB that faces the base layer BSL. The connecting pads CPD may be disposed on the ground pad 1-1 GPD1-1 and the first ground pattern GPT1. The ground pad 1-1 GPD1-1 and the first ground pattern GPT1 may be connected to the connecting pads CPD. The flexible circuit board FPCB may be connected to the ground pad 1-1 GPD1-1 and the first ground pattern GPT1 by the connecting pads CPD.

An anisotropic conductive film ACF may be disposed between the ground pad 1-1 GPD1-1 and the connecting pad CPD facing the ground pad 1-1 GPD1-1. An anisotropic conductive film ACF may be disposed between the one end or an end OE of the first ground pattern GPT1 and the connecting pad CPD facing the one end or an end OE of the first ground pattern GPT1. The ground pad 1-1 GPD1-1 and the one end or an end OE of the first ground pattern GPT1 may be electrically connected to the connecting pads CPD by the anisotropic conductive films ACF.

The input sensing part ISP-1 may further include a first connecting line CLI1. The first connecting line CLI1 may be disposed on the lower surface of the flexible circuit board FPCB. First connecting lines CLI1 may be provided.

The first connecting line CLI1 may be disposed between the connecting pads CPD and may be electrically connected to the connecting pads CPD. Accordingly, the ground pad 1-1 GPD1-1 and the one end or an end OE of the first ground pattern GPT1 may be electrically connected by the first connecting line CLI1 and the connecting pads CPD.

Although not illustrated, the ground pad 2-1 GPD2-1 and the one end or an end OE of the second ground pattern GPT2 may be electrically connected by a first connecting line CLI1 and connecting pads CPD. Furthermore, the ground pad 1-2 GPD1-2 and the ground pad 2-2 GPD2-2 may be electrically connected with the opposite ends of the third ground pattern GPT3 by first connecting lines CLI1 and connecting pads CPD.

The base layer BSL and the flexible circuit board FPCB may be bent along the bending line BL. Accordingly, when viewed in the third direction DR3, the portion between the upper side of the input sensing part ISP-1 and the bending line BL may not be exposed to the outside. Thus, the inactive area NAA exposed to the outside may be reduced.

Figure 19:
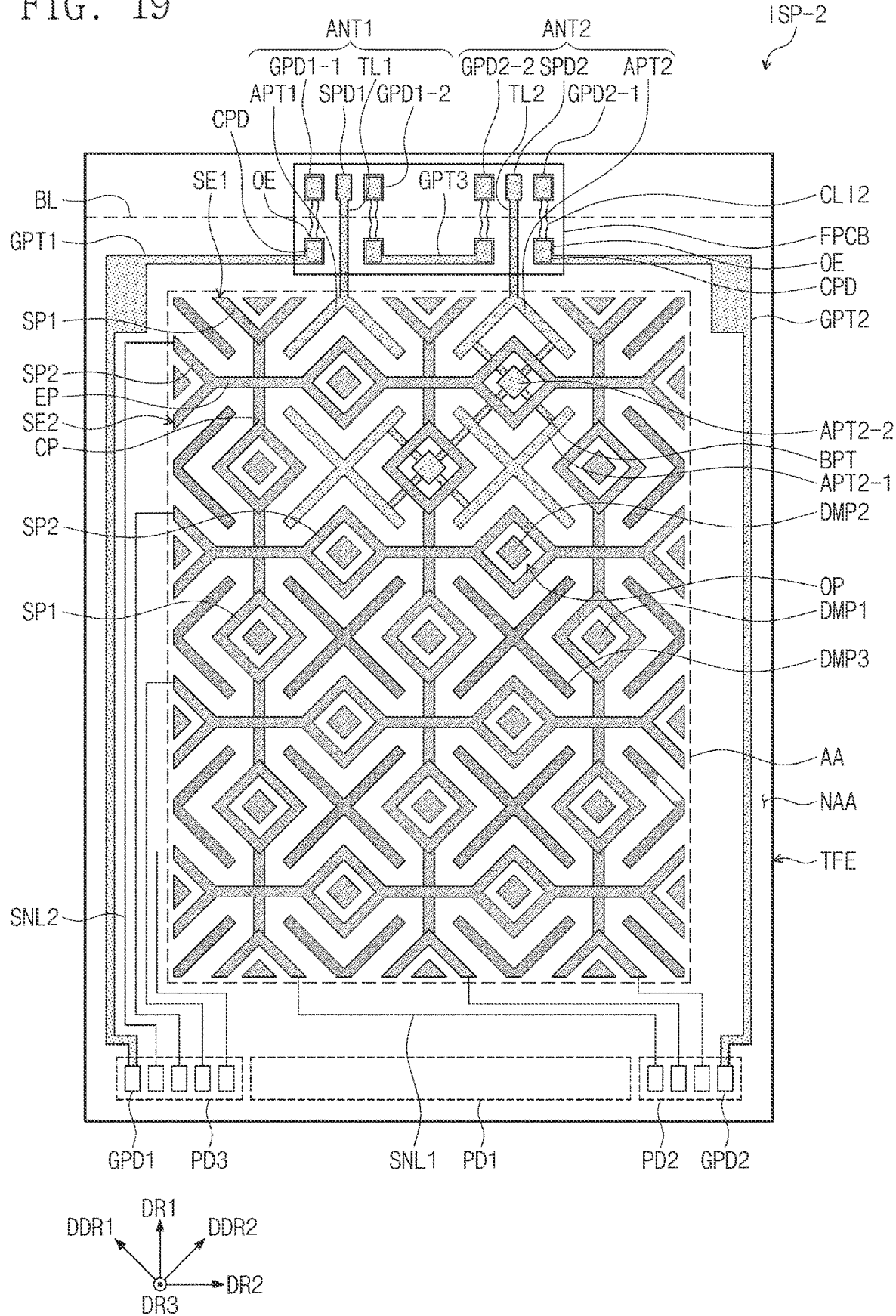
FIG. 19 is a view illustrating a configuration of an input sensing part according to an embodiment.
Figure 20:
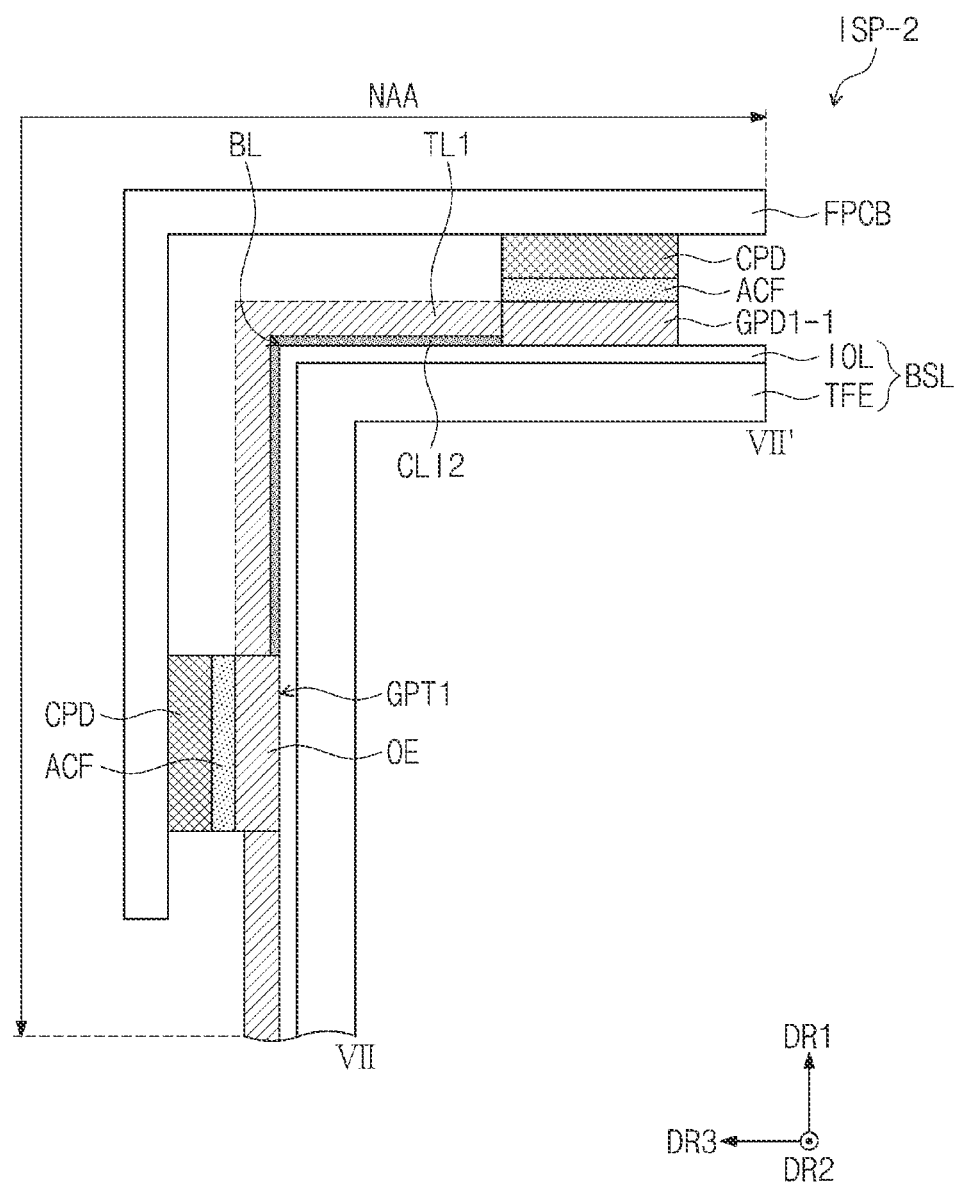
FIG. 20 is a schematic cross-sectional view illustrating a ground pad 1-1 and one end or an end of a first ground pattern that are connected to a first connecting line illustrated in FIG. 19.

FIG. 19 is a view illustrating a configuration of an input sensing part according to an embodiment. FIG. 20 is a schematic cross-sectional view illustrating a ground pad 1-1 and one end or an end of a first ground pattern that are connected to a first connecting line illustrated in FIG. 19.

FIG. 19 is a schematic plan view corresponding to FIG. 6, and FIG. 20 is a schematic cross-sectional view corresponding to FIG. 18. The input sensing part ISP-2 may have the same configuration as the input sensing part ISP-1 illustrated in FIGS. 17 and 18, except that the input sensing part ISP-2 may include second connecting lines CLI2. Accordingly, the following description will be focused on the difference between the input sensing part ISP-1 illustrated in FIGS. 17 and 18 and the input sensing part ISP-2 illustrated in FIGS. 19 and 20.

Referring to FIG. 19, a flexible circuit board FPCB may be connected to a ground pad 1-1 GPD1-1, a ground pad 1-2 GPD1-2, a ground pad 2-1 GPD2-1, a ground pad 2-2 GPD2-2, one end or an end OE of a first ground pattern GPT1, one end or an end OE of a second ground pattern GPT2, and opposite ends of a third ground pattern GPT3 by connecting pads CPD.

The input sensing part ISP-2 may further include the second connecting lines CLI2. The second connecting lines CLI2 may extend in the second direction DR2 and may have a wavy shape.

Second connecting lines CLI2 may be disposed between the ground pad 1-1 GPD1-1 and the one end or an end OE of the first ground pattern GPT1. The ground pad 1-1 GPD1-1 and the one end or an end OE of the first ground pattern GPT1 may be connected to the second connecting lines CLI2. The ground pad 1-1 GPD1-1 and the one end or an end OE of the first ground pattern GPT1 may be electrically connected by the second connecting lines CLI2.

Second connecting lines CLI2 may be disposed between the ground pad 2-1 GPD2-1 and the one end or an end OE of the second ground pattern GPT2. The ground pad 2-1 GPD2-1 and the one end or an end OE of the second ground pattern GPT2 may be connected to the second connecting lines CLI2. The ground pad 2-1 GPD2-1 and the one end or an end OE of the second ground pattern GPT2 may be electrically connected by the second connecting lines CLI2.

Second connecting lines CLI2 may be disposed between the ground pads GPD1-2 and GPD2-2 and the opposite ends of the third ground pattern GPT3. The ground pads GPD1-2 and GPD2-2 and the opposite ends of the third ground pattern GPT3 may be connected to the second connecting lines CLI2. The ground pads GPD1-2 and GPD2-2 and the opposite ends of the third ground pattern GPT3 may be electrically connected by the second connecting lines CLI2.

Referring to FIG. 20, the second connecting lines CLI2 may be disposed on a base layer BSL and may electrically connect the ground pad 1-1 GPD1-1 and the one end or an end OE of the first ground pattern GPT1. The flexible circuit board FPCB may be connected to the ground pad 1-1 GPD1-1 and the one end or an end OE of the first ground pattern GPT1 by the connecting pads CPD.

The base layer BSL and the flexible circuit board FPCB may be bent along a bending line BL. In case that the second connecting lines CLI2 have a wavy shape, a bending portion of the base layer BSL may have rigidity against bending stress, as compared with in case that the second connecting lines CLI2 have a straight shape in the second direction DR2.

Figure 21:
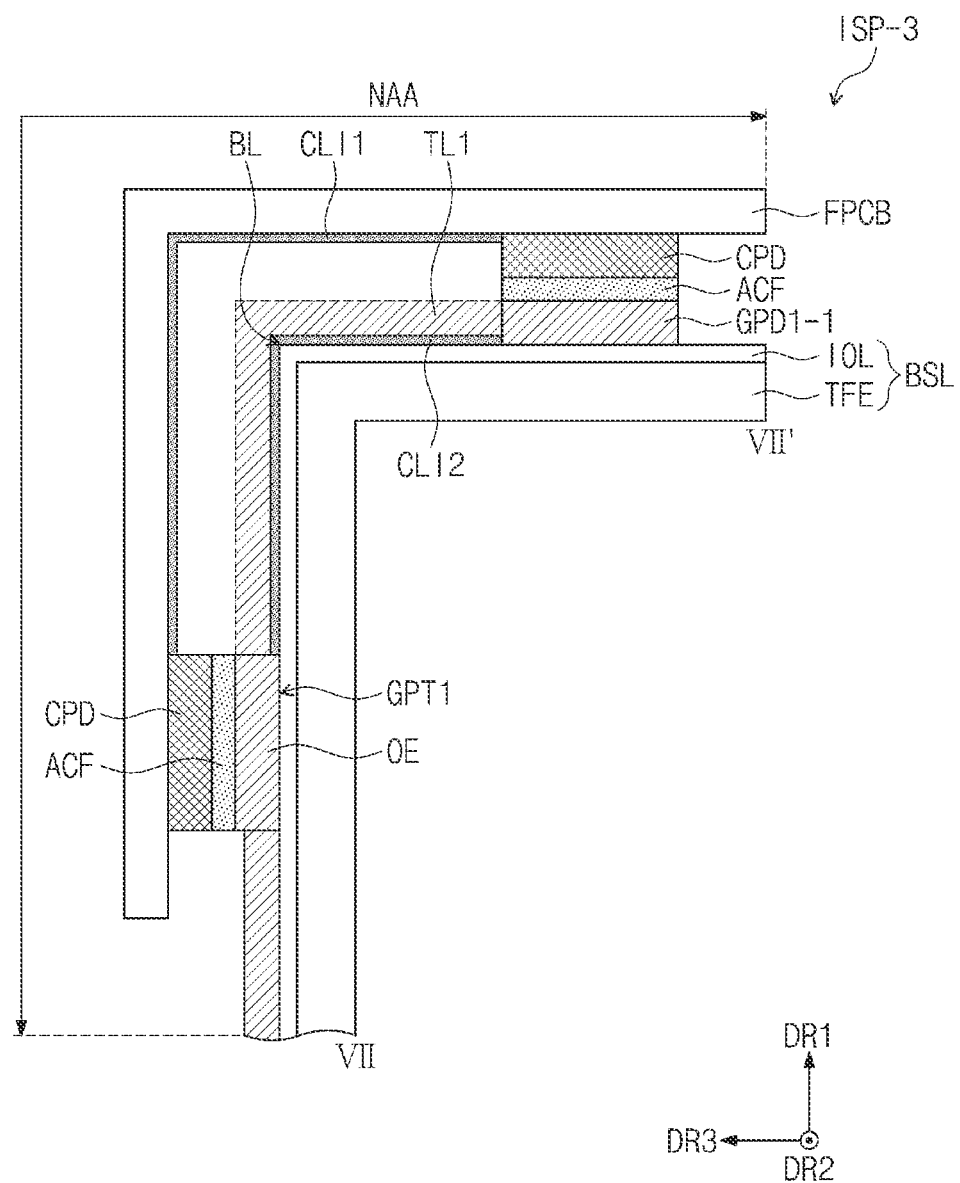
FIG. 21 is a view illustrating a configuration of an input sensing part according to an embodiment.

FIG. 21 is a view illustrating a configuration of an input sensing part according to an embodiment.

FIG. 21 is a schematic cross-sectional view corresponding to FIGS. 18 and 20. The following description will be focused on the difference between the input sensing parts ISP-1 and ISP-2 illustrated in FIGS. 18 and 20 and the input sensing part ISP-3 illustrated in FIG. 21.

Referring to FIG. 21, a first connecting line CLI1 disposed on a lower surface of a flexible circuit board FPCB may be electrically connected to a ground pad 1-1 GPD1-1 and one end or an end OE of a first ground pattern GPT1 by connecting pads CPD and anisotropic conductive films ACF as illustrated in FIG. 18. For example, the one end or an end OE of the first ground pattern GPT1 and the ground pad 1-1 GPD1-1 may be electrically connected by the first connecting line CLI, the connecting pads CPD, and the anisotropic conductive films ACF. Furthermore, the one end or an end OE of the first ground pattern GPT1 and the ground pad 1-1 GPD1-1 may be electrically connected by a second connecting line CLI2 disposed on a base layer BSL.

Although not illustrated, a ground pad 2-1 GPD2-1 and one end or an end OE of a second ground pattern GPT2 may be electrically connected by first and second connecting lines CLI1 and CLI2. Furthermore, a ground pad 1-2 GPD1-2 and a ground pad 2-2 GPD2-2 may be electrically connected with opposite ends of a third ground pattern GPT3 by first and second connecting lines CLI1 and CLI2.

Figure 22:
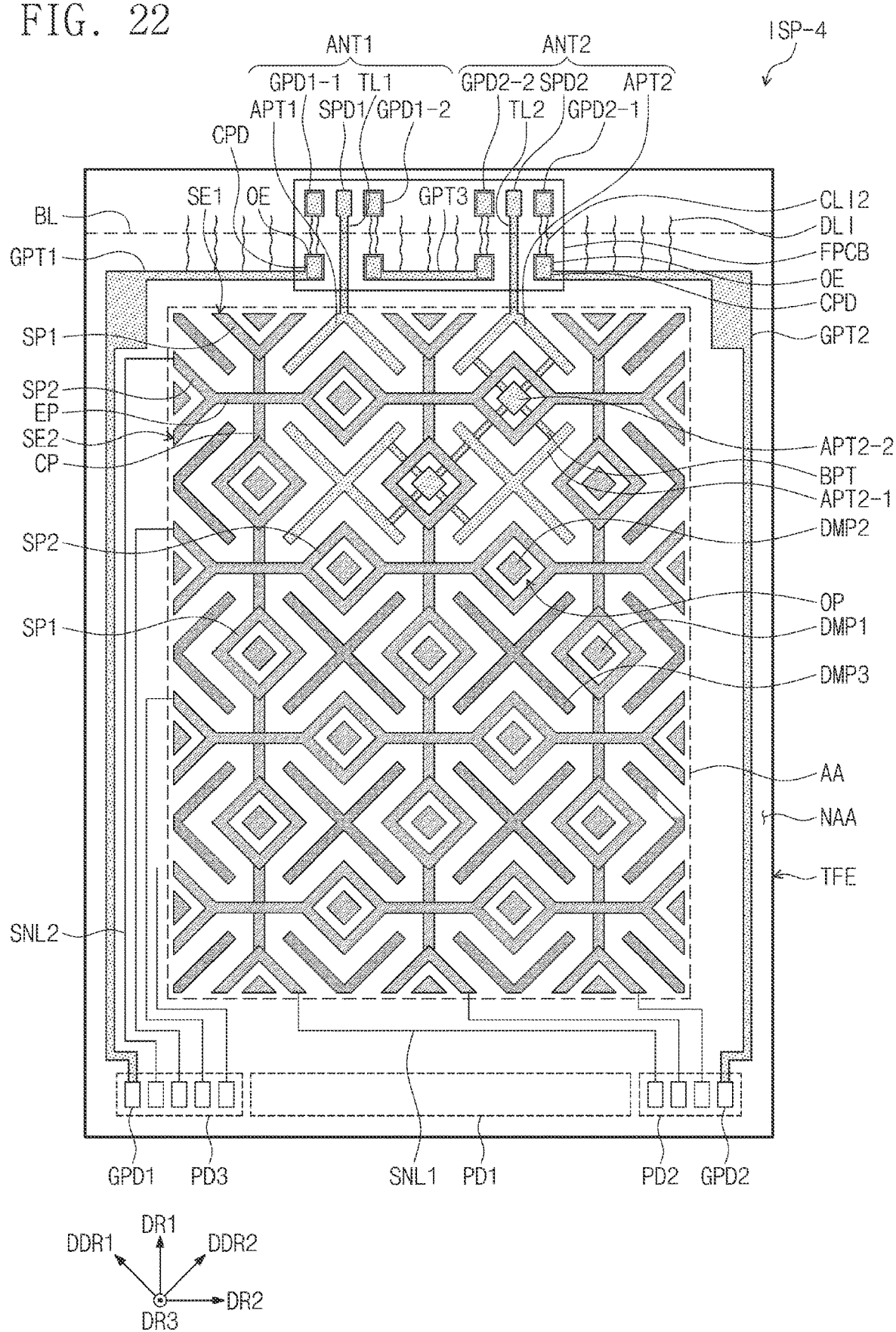
FIG. 22 is a view illustrating a configuration of an input sensing part according to an embodiment.

FIG. 22 is a view illustrating a configuration of an input sensing part according to an embodiment.

FIG. 22 is a schematic plan view corresponding to FIG. 19. The input sensing part ISP-4 may have the same configuration as the input sensing part ISP-2 illustrated in FIG. 19, except that the input sensing part ISP-4 may include dummy lines DLI. Accordingly, the following description will be focused on the difference between the input sensing part ISP-2 illustrated in FIG. 19 and the input sensing part ISP-4 illustrated in FIG. 22.

Referring to FIG. 22, the input sensing part ISP-4 may further include the dummy lines DLI. The dummy lines DLI may be disposed in an inactive area NAA adjacent to an upper side of an active area AA. The dummy lines DLI may be substantially disposed on the base layer BSL illustrated in FIG. 20. The dummy lines DLI may be disposed near first and second antennas ANT1 and ANT2 in the inactive area NAA.

The dummy lines DLI may be disposed near second connecting lines CLI2. The dummy lines DLI may be disposed near a ground pad 1-1 GPD1-1, a ground pad 1-2 GPD1-2, a ground pad 2-1 GPD2-1, and a ground pad 2-2 GPD2-2.

The dummy lines DLI may be connected to first, second, and third ground patterns GPT1, GPT2, and GPT3. The dummy lines DLI may have a wavy shape similar to the second connecting lines CLI2.

In case that only the first and second antennas ANT1 and ANT2 and the second connecting lines CLI2 are disposed in the inactive area NAA adjacent to the upper side of the active area AA, the shapes of the first and second antennas ANT1 and ANT2 and the second connecting lines CLI2 may be visible from the outside.

In an embodiment, the dummy lines DLI having a shape similar to the shape of the second connecting lines CLI2 may be disposed in the inactive area NAA adjacent to the upper side of the active area AA. In case that the dummy lines DLI having a shape similar to the shape of the second connecting lines CLI2 are disposed near the second connecting lines CLI2, the shapes of the first and second antennas ANT1 and ANT2 and the second connecting lines CLI2 may not be visible from the outside.

According to embodiments, the ground patterns and the antennas disposed in the inactive area of the input sensing part may not be separately disposed in the state of being separated from each other, and the ground patterns may be connected to the ground terminals of the antennas. The region for the arrangement of the ground patterns and the antennas may be decreased, and thus the inactive area may be decreased.

While the disclosure has been described with reference to embodiments thereof, it will be apparent to those of ordinary skill in the art that various changes and modifications may be made thereto without departing from the spirit and scope of the disclosure and as set forth in the following claims.

What is claimed is:

1. An input sensing part comprising:
   sensing electrodes disposed in an active area;
   a first ground pattern disposed in an inactive area around the active area;
   a first ground pad disposed in the inactive area and electrically connected to the first ground pattern;
   a first antenna pattern insulated from the sensing electrodes and disposed in the active area;
   a first signal pad extending from the first antenna pattern and disposed in the inactive area;
   a 1-1-th ground pad disposed adjacent to the first signal pad and electrically connected to the first ground pattern; and
   a 1-2-th ground pad disposed adjacent to the first signal pad.

2. The input sensing part of claim 1, wherein the first antenna pattern is disposed between a number of the sensing electrodes.

3. The input sensing part of claim 1, wherein the first ground pattern, the first signal pad, and the 1-1-th ground pad are disposed on a same layer.

4. The input sensing part of claim 3, wherein the 1-1-th ground pad extends from the first ground pattern and is integral with the first ground pattern.

5. The input sensing part of claim 1, further comprising:
   a second ground pattern disposed in the inactive area;
   a second ground pad disposed in the inactive area and electrically connected to the second ground pattern;
   a second antenna pattern insulated from the sensing electrodes and disposed in the active area;
   a second signal pad extending from the second antenna pattern and disposed in the inactive area;
   a 2-1-th ground pad disposed adjacent to the second signal pad and electrically connected to the second ground pattern; and
   a 2-2-th ground pad disposed adjacent to the second signal pad.

6. The input sensing part of claim 5, wherein the 2-1-th ground pad extends from the second ground pattern and is integral with the second ground pattern.

7. The input sensing part of claim 5, further comprising:
   a third ground pattern electrically connected to the 1-2-th ground pad and the 2-2-th ground pad.

8. The input sensing part of claim 7, wherein the 1-2-th ground pad and the 2-2-th ground pad extend from the third ground pattern and are integral with the third ground pattern.

9. The input sensing part of claim 7, wherein
   the 1-1-th ground pad, the 1-2-th ground pad, the 2-1-th ground pad, the 2-2-th ground pad, the first ground pattern, the second ground pattern, and the third ground pattern are disposed on different layers, and
   the 1-1-th ground pad, the 1-2-th ground pad, the 2-1-th ground pad, and the 2-2-th ground pad are electrically connected to the first ground pattern, the second ground pattern, and the third ground pattern.

10. The input sensing part of claim 5, wherein the second antenna pattern is disposed between a number of the sensing electrodes.

11. The input sensing part of claim 5, wherein the second antenna pattern includes:
    a 2-1-th antenna pattern disposed between a number of the sensing electrodes;
    a 2-2-th antenna pattern disposed in at least one opening of at least one of the sensing electrodes; and
    a bridge pattern electrically connecting the 2-1-th antenna pattern and the 2-2-th antenna pattern.

12. The input sensing part of claim 1, further comprising:
    dummy patterns disposed between the sensing electrodes and in openings of the sensing electrodes.

13. The input sensing part of claim 1, further comprising:
    a base layer including the active area and the inactive area in the base layer; and
    a flexible circuit board disposed on the base layer and electrically connected to an end of the first ground pattern and the 1-1-th ground pad, wherein
    the end of the first ground pattern and the 1-1-th ground pad are spaced apart from each other in a first direction,
    a bending line extending in a second direction intersecting the first direction is defined between the end of the first ground pattern and the 1-1-th ground pad, and
    the base layer and the flexible circuit board are bent along the bending line.

14. The input sensing part of claim 13, further comprising:
    at least one first connecting line disposed on the flexible circuit board and electrically connecting the end of the first ground pattern and the 1-1-th ground pad.

15. The input sensing part of claim 13, further comprising:
    at least one second connecting line disposed on the base layer and electrically connecting the end of the first ground pattern and the 1-1-th ground pad, the second connecting line having a wavy shape.

16. The input sensing part of claim 13, further comprising:
    at least one first connecting line disposed on the flexible circuit board and electrically connecting the end of the first ground pattern and the 1-1-th ground pad; and
    at least one second connecting line disposed on the base layer and electrically connecting the end of the first ground pattern and the 1-1-th ground pad.

17. The input sensing part of claim 16, further comprising:
    dummy lines disposed near the at least one second connecting line.

18. The input sensing part of claim 17, wherein the dummy lines are electrically connected to the first ground pattern.

19. An input sensing part comprising:
    sensing electrodes disposed in an active area;
    a ground pattern disposed in an inactive area around the active area;
    a ground pad disposed in the inactive area and electrically connected to the ground pattern; and
    an antenna disposed in the active area and extending to the inactive area,
    wherein the ground pattern is electrically connected to a ground terminal of the antenna.

20. A display device comprising:
a display panel; and
an input sensing part disposed on the display panel,
wherein the input sensing part includes:
- sensing electrodes disposed in an active area;
- a first ground pattern disposed in an inactive area around the active area;
- a first ground pad disposed in the inactive area and electrically connected to the first ground pattern;
- a first antenna pattern insulated from the sensing electrodes and disposed in the active area;
- a first signal pad extending from the first antenna pattern and disposed in the inactive area;
- a 1-1-th ground pad disposed adjacent to the first signal pad and electrically connected to the first ground pattern; and
- a 1-2-th ground pad disposed adjacent to the first signal pad.

* * * * *